(12) United States Patent
Kikuchi et al.

(10) Patent No.: US 8,288,804 B2
(45) Date of Patent: Oct. 16, 2012

(54) FIELD EFFECT TRANSISTOR AND METHOD FOR MANUFACTURING THE SAME

(75) Inventors: Hiroaki Kikuchi, Hokkaido (JP);
Osamu Takahashi, Hokkaido (JP);
Katsunori Kondo, Hokkaido (JP);
Tomoaki Yamabayashi, Hokkaido (JP);
Kunio Ogasawara, Hokkaido (JP);
Tadashi Ishigaki, Hokkaido (JP);
Yutaka Hienuki, Hokkaido (JP);
Motonori Nakamura, Hokkaido (JP);
Agus Subagyo, Hokkaido (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 73 days.

(21) Appl. No.: 12/991,958

(22) PCT Filed: May 22, 2009

(86) PCT No.: PCT/JP2009/002269
§ 371 (c)(1),
(2), (4) Date: Nov. 10, 2010

(87) PCT Pub. No.: WO2009/144902
PCT Pub. Date: Dec. 3, 2009

(65) Prior Publication Data
US 2011/0062419 A1    Mar. 17, 2011

(30) Foreign Application Priority Data
May 29, 2008 (JP) .................. 2008-141161

(51) Int. Cl.
*H01L 29/72* (2006.01)
(52) U.S. Cl. ........ 257/288; 257/659; 438/585; 438/761; 977/742; 977/938
(58) Field of Classification Search .................. 257/288, 257/659; 438/585, 938; 977/742, 938
See application file for complete search history.

(56) References Cited

U.S. PATENT DOCUMENTS

| | | |
|---|---|---|
| 2005/0189883 A1 | 9/2005 | Suh et al. |
| 2005/0271648 A1 | 12/2005 | Sugiyama et al. |
| 2008/0044954 A1* | 2/2008 | Furukawa et al. ............ 438/129 |

(Continued)

FOREIGN PATENT DOCUMENTS

JP    2005-244240 A    9/2005

(Continued)

OTHER PUBLICATIONS

Maruyama, et al., "Low-temperature synthesis of high-purity single-walled carbon nanotubes from alcohol," Chemical Physics Letters 360 (2002) 229-234.

(Continued)

*Primary Examiner* — Edward Wojciechowicz
(74) *Attorney, Agent, or Firm* — Kubotera & Associates, LLC

(57) ABSTRACT

Provided is a carbon nanotube field effect transistor manufacturing method wherein carbon nanotube field effect transistors having excellent stable electric conduction property are manufactured with excellent reproducibility. After arranging carbon nanotubes to be a channel on a substrate, the carbon nanotubes are covered with an insulating protection film. Then, a source electrode and a drain electrode are formed on the insulating protection film. At this time, a contact hole is formed on the protection film, and the carbon nanotubes are connected with the source electrode and the drain electrode. Then, a wiring protection film, a conductive film and a plasma CVD film are sequentially formed on the insulating protection film, the source electrode and the drain electrode. In the field effect transistor thus manufactured, since the carbon nanotubes to be the channel are not contaminated and not damaged, excellent stable electric conductive property is exhibited.

9 Claims, 19 Drawing Sheets

U.S. PATENT DOCUMENTS

| | | |
|---|---|---|
| 2009/0008629 A1 | 1/2009 | Matsumoto et al. |
| 2010/0227058 A1 | 9/2010 | Zhang et al. |

FOREIGN PATENT DOCUMENTS

| | | |
|---|---|---|
| JP | 2006-222279 A | 8/2006 |
| JP | 2007-161576 A | 6/2007 |
| JP | 2008-071898 A | 3/2008 |
| WO | 2004/041719 A | 5/2004 |

OTHER PUBLICATIONS

Huang, et al., "Long and Oriented Single-Walled Carbon Nanotubes Grown by Ethanol Chemical Vapor Deposition," J. Phys. Chem. B 2004, 108, 16451-16456.

Shigeo Maruyama, "CVD Generation of Single-Walled Carbon Nanotubes from Alcohol," Journal of the Surface Science Society of Japan 25(6), 318-325, Jun. 10, 2004.

* cited by examiner

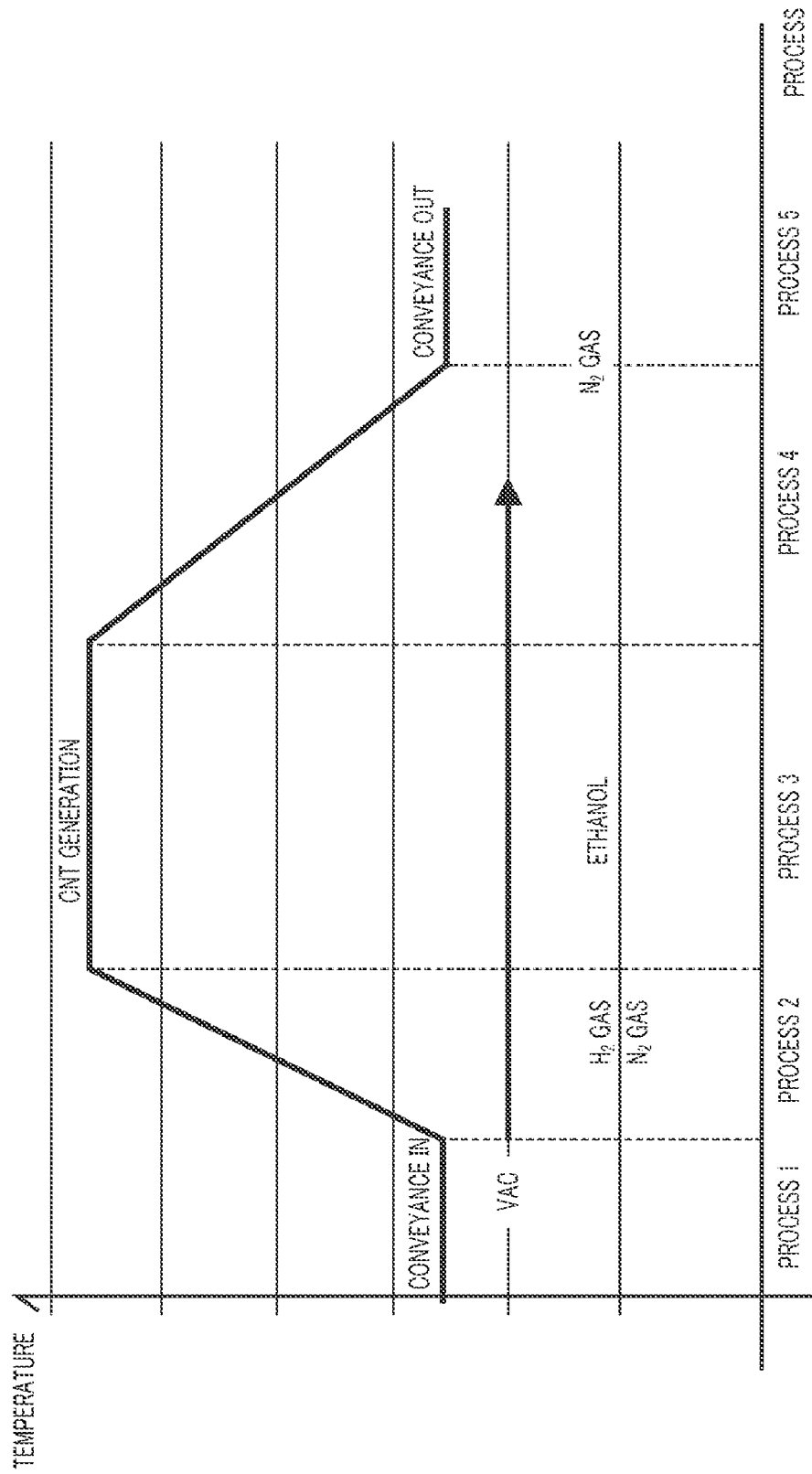

FIELD EFFECT TRANSISTOR AND METHOD FOR MANUFACTURING THE SAME

TECHNICAL FIELD

The present invention relates to a field-effect transistor using carbon nanotubes as a channel, and a method of manufacturing the field-effect transistor.

BACKGROUND ART

A carbon nanotube (hereinafter referred to as "CNT") is a tubular substance composed of carbon atoms that exhibits a semiconducting or metallic property by chirality. A CNT has a diameter of several nanometers, and its current density is high, making possible the formation of extremely narrow wiring with one-dimensional conduction, and offering the potential for application to quantum devices capable of high-speed operation. In recent years, research has been actively carried out into the use of CNTs exhibiting a semiconducting property as a channel of a field-effect transistor (hereinafter referred to as "FET") (see Patent Literature 1, for example).

A field-effect transistor in which CNTs are used as a channel (hereinafter referred to as "CNT-FET") is manufactured, for example, by growing CNTs from a catalyst formed on a substrate, and then forming a source electrode and drain electrode at either end of the CNTs, respectively (see Patent Literature 2, for example).

Patent Literature 2 describes a manufacturing method for a CNT-FET having an n-type channel. In this method, a CNT-FET is manufactured by (1) growing CNTs from a catalyst formed on a substrate, (2) forming a source electrode and a drain electrode at either end of the CNTs, respectively, and (3) forming a film of a nitrogen compound (for example, silicon nitride) on the CNTs.

Citation List
Patent Literature
[PTL 1] Japanese Patent Application Laid-Open No. 2008-71898
[PTL 2] Japanese Patent Application Laid-Open No. 2006-222279

SUMMARY OF INVENTION

Technical Problem

However, a problem with the above conventional manufacturing technology is that CNT-FETs stably exhibiting an excellent electrical conduction property cannot be manufactured with good reproducibility.

In the above conventional manufacturing method, CNTs that serve as a channel are exposed to a cleaning chemical, a resist for patterning or the like during the formation of electrodes, resulting in the formation of defects or contamination with residual resist. The defects formed in this way degrade the electrical conduction property of the CNT-FET. Also, CNTs with many defects tend to adsorb oxygen, water molecules and so forth from the air, so that the formed defects also cause hysteretic characteristics with respect to CNT-FET gate bias together with contaminants that are not completely removed during the manufacturing process.

It is therefore an object of the present invention to provide a method that enables CNT-FETs stably exhibiting an excellent electrical conduction property to be manufactured with good reproducibility, and a CNT-FET manufactured by means of that method.

Solution to Problem

The present inventors have found that (1) the above problem can be solved by forming an insulating protective film covering the CNTs before forming the electrodes. Also, the present inventors have found that (2) a CNT-FET that is highly moisture-resistant and has good mechanical strength can be manufactured when a final protective film (plasma CVD film) is additionally formed by plasma CVD, and (3) damage to the CNTs by plasma or the like when the plasma CVD film is formed can be prevented by forming a conductive film before forming the plasma CVD film.

That is to say, the present invention relates to the following FETs and manufacturing methods thereof.

[1] An FET having: a gate insulating film; a channel including CNTs arranged on the gate insulating film; an insulating protective film covering the CNTs; a source electrode and drain electrode that are arranged on the insulating protective film and are electrically connected to the CNTs via contact holes formed in the insulating protective film; a gate electrode formed on the gate insulating film; a plasma CVD film covering the insulating protective film; and a conductive film formed between the insulating protective film and the plasma CVD film.

[2] The FET described in [1], further having a wiring protective film protecting the source electrode and the drain electrode between the insulating protective film and the conductive film.

[3] The FET described in [1] or [2], in which: the gate insulating film is formed on a first surface and a second surface of a semiconductor substrate, the first surface and second surfaces constituting both sides of the semiconductor substrate; the source electrode and the drain electrode are formed on the first surface of the semiconductor substrate on which the gate insulating film is formed; and the gate electrode is formed on the gate insulating film formed on the second surface of the semiconductor substrate.

[4] The FET described in [1] or [2], in which: the gate insulating film is formed on either or both surfaces of a semiconductor substrate; and the gate electrode, the source electrode and the drain electrode are formed on the gate insulating film formed on one of the surfaces of the semiconductor substrate.

[5] The FET described in any one of [1] through [4], in which the conductive film is formed in an area covering the CNTs.

[6] The FET described in any one of [1] through [5], in which the edges of the conductive film are covered by the plasma CVD film.

[7] The FET described in any one of [1] through [6], in which the thickness of the conductive film is between 10 nm and 1,000 nm.

[8] The FET described in any one of [1] through [7], in which the thickness of the gate insulating film is between 50 nm and 1,000 nm.

[9] An FET manufacturing method that includes the steps of: forming a gate insulating film; arranging CNTs on the gate insulating film; forming an insulating protective film covering the CNTs; forming on the insulating protective film a source electrode and drain electrode that are electrically connected to the CNTs via contact holes formed in the insulating protective film; forming a wiring protective film that protects the source electrode and the drain electrode; forming a conductive film on the wiring protective film; and forming a plasma CVD film on the conductive film.

Also, the above problem can be solved by means of the following FETs and manufacturing method thereof.

[1] An FET with CNTs as a channel, comprising: a semiconductor substrate having an insulating film; CNTs arranged on the insulating film; an insulating protective film covering the CNTs; and a source electrode and drain electrode that are arranged on the insulating protective film and are electrically connected to the CNTs via contact holes formed in the insulating protective film.

[2] The FET described in [1], in which the source electrode and drain electrode are connected only to a side surface of the CNTs.

[3] The FET described in [1] or [2], in which the insulating film is a two-layered structure in which a silicon nitride film is stacked on a silicon oxide film.

[4] The FET described in any one of [1] through [3], in which the insulating protective film includes silicon oxide, silicon nitride, aluminum oxide, hafnium oxide, zirconium oxide, or titanium oxide.

[5] A manufacturing method of an FET with CNTs as a channel, including the steps of: preparing a semiconductor substrate having an insulating film; arranging CNTs on the insulating film of the semiconductor substrate; forming an insulating protective film on the CNTs; forming a contact hole in an intended source electrode formation area and an intended drain electrode formation area respectively of the insulating protective film, and exposing part of the CNTs; forming a source electrode on the intended source electrode formation area of the insulating protective film so as to enable electrical connection to the CNTs via the contact hole; and forming a drain electrode on the intended drain electrode formation area of the insulating protective film so as to enable electrical connection to the CNTs via the contact hole.

[6] The FET manufacturing method described in [5], in which the arranging the CNTs includes; forming at least two catalyst layers on the insulating film of the semiconductor substrate; and growing CNTs by means of chemical vapor deposition so as to connect between the catalyst layers.

[7] The FET manufacturing method described in [5] or [6], in which the insulating film is a two-layered structure in which a silicon nitride film is stacked on a silicon oxide film.

[8] The FET manufacturing method described in any one of [5] through [7], in which the contact holes are formed by wet etching.

[9] The FET manufacturing method described in [8], in which the etching solution used for the wet etching contains hydrofluoric acid.

[10] The FET manufacturing method described in any one of [5] through [9], in which the insulating protective film includes silicon oxide, silicon nitride, aluminum oxide, hafnium oxide, zirconium oxide, or titanium oxide.

[11] A manufacturing method of an FET with CNTs as a channel, including the steps of: preparing a semiconductor substrate having an orientation flat or notch and having an insulating film; partitioning the semiconductor substrate in a lattice shape and forming a plurality of areas for forming one FET; forming at least two catalyst layers on the insulating film of the semiconductor substrate in each of the areas; growing CNTs from a catalyst layer by means of chemical vapor deposition in each of the areas, and arranging the CNTs so as to connect between the catalyst layers; forming an insulating protective film on the CNTs in each of the areas; forming a contact hole in an intended source electrode formation area and an intended drain electrode formation area respectively of the insulating protective film in each of the areas, and exposing part of the CNTs; forming a source electrode on the intended source electrode formation area of the insulating protective film in each of the areas so as to enable electrical connection to the CNTs via the contact hole; and forming a drain electrode on the intended drain electrode formation area of the insulating protective film in each of the areas so as to enable electrical connection to the CNTs via the contact hole.

In the above inventions, CNTs may also be formed by means of the following CNT manufacturing methods.

[1] A CNT manufacturing method that is a method of manufacturing CNTs on a plurality of substrates using a chemical vapor deposition apparatus having a tubular chamber that has a processing room for executing processing on a substrate, a gas introduction section for introducing gas for executing processing on the substrate into the processing room, an exhaust section that discharges gas that is inside the processing room, a substrate conveyance-in/out section for conveying a jig charged with a plurality of substrates into and out of the processing room, and a heater that is provided around the chamber and adjusts the temperature of a substrate inside the processing room; wherein the CNT manufacturing method includes the steps of: (1) preparing a plurality of substrates on which is arranged a catalyst for CNT vapor deposition on the planar surface of a substrate having a planar surface; (2) separating the plurality of substrates from each other, charging a jig therewith, and conveying the jig into a processing room; (3) discharging gas that is inside the processing room via the exhaust section and making the atmospheric pressure inside the processing room lower than the outside air pressure; (4) introducing a reduction gas and an inert gas into the processing room, and raising the temperature of the substrate to a CNT generation temperature by means of the heater; (5) introducing a source gas for CNT generation into the processing room, and generating CNTs on the planar surface of the substrate; (6) after the CNT generation, lowering the temperature of the substrate to a temperature at which the CNTs are not oxidized by oxygen in the air; (7) bringing the atmospheric pressure inside the processing room to the outside air pressure; and (8) conveying the jig charged with the plurality of substrates out of the processing room.

[2] The manufacturing method described in [1], in which the substrate is a substantially circular semiconductor substrate having an orientation flat or notch.

[3] The manufacturing method described in [1] or [2], in which the carbon nanotube generation temperature is between 700° C. and 900° C.

[4] The manufacturing method described in any one of [1] through [3], in which the temperature at which the CNTs are not oxidized by oxygen in the air is 600° C. or below.

[5] The manufacturing method described in any one of [1] through [4], in which the atmospheric pressure lower than the outside air pressure in step (3) is between 0.1 Torr and 0.6 Torr.

[6] The manufacturing method described in any one of [1] through [5], in which the source gas is a vapor of a substance that is a liquid at normal temperature.

[7] The manufacturing method described in any one of [1] through [6], in which the source gas is ethanol.

[8] A CNT manufacturing method that is a method of manufacturing CNTs on a plurality of substrates using a chemical vapor deposition apparatus having a tubular chamber that has a processing room for executing processing on a substrate, a gas introduction section for introducing gas for executing processing on the substrate into the processing room, an exhaust section that discharges gas that is inside the processing room, a substrate conveyance-in/out section for conveying a jig charged with a plurality of substrates into and out of the processing room, and a heater that is provided around the chamber and adjusts the temperature of a substrate inside the processing room; wherein the CNT manufacturing method includes: (1) preparing a plurality of substrates that are substantially circular semiconductor substrates having an orientation flat or notch, have a plurality of areas partitioned in a lattice shape on a planar surface thereof, and on which is arranged a catalyst for CNT vapor deposition in each of the plurality of areas; (2) separating the plurality of substrates from each other, charging a jig therewith with the planar surfaces parallel to each other, and conveying the jig into a processing room; (3) discharging gas that is inside the processing room via the exhaust section and making the atmospheric pressure inside the processing room lower than the outside air pressure; (4) introducing a reduction gas and an inert gas into the processing room, and raising the temperature of the substrate to a CNT generation temperature by means of the heater; (5) introducing a source gas for CNT generation into the processing room, and generating CNTs on the planar surface of the substrate; (6) after the CNT generation, lowering the temperature of the substrate to a temperature at which the CNTs are not oxidized by oxygen in the air; (7) bringing the atmospheric pressure inside the processing room to the outside air pressure; and (8) conveying the jig charged with the plurality of substrates out of the processing room.

[9] The manufacturing method described in [8], in which the substrate is a semiconductor substrate.

[10] The manufacturing method described in [8] or [9], in which the carbon nanotube generation temperature is between 700° C. and 900° C.

[11] The manufacturing method described in any one of [8] through [10], in which the temperature at which the carbon nanotubes are not oxidized by oxygen in the air is 600° C. or below.

[12] The manufacturing method described in any one of [8] through [11], in which the atmospheric pressure lower than the outside air pressure in step (3) is between 0.1 Torr and 0.6 Torr.

[13] The manufacturing method described in any one of [8] through [12], in which the source gas is a vapor of a substance that is a liquid at normal temperature.

[14] The manufacturing method described in any one of [8] through [13], in which the source gas is ethanol.

[15] A CNT manufacturing method that is a method of manufacturing CNTs on a substrate using a chemical vapor deposition apparatus having a chamber that has a processing room for executing processing on the substrate, a gas introduction section for introducing gas for executing processing on the substrate into the processing room, an exhaust section that discharges gas that is inside the processing room, a substrate conveyance-in/out section whereby a plurality of substrates with which a jig is charged are conveyed into and conveyed out from the processing room one at a time, and a heater placed inside the processing room; wherein the CNT manufacturing method includes: (1) preparing a plurality of substrates that are substantially circular semiconductor substrates having an orientation flat or notch, have a plurality of areas partitioned in a lattice shape on a planar surface thereof, and on which is arranged a catalyst for CNT vapor deposition in each of the plurality of areas; (2) discharging gas that is inside the processing room via the exhaust section and making the atmospheric pressure inside the processing room lower than the outside air pressure; (3) conveying one of the substrates into the processing room; (4) raising the temperature of a substrate conveyed into the processing room to a CNT generation temperature; (5) introducing a source gas for CNT generation into the processing room, and generating CNTs on a planar surface of the substrate; (6) after the CNT generation, lowering the temperature of the substrate to a temperature at which the CNTs are not oxidized by oxygen in the air; and (7) conveying the substrate out of the processing room.

[16] The manufacturing method described in [15], in which the substrate is a semiconductor substrate.

[17] The manufacturing method described in [15] or [16], in which the chemical vapor deposition apparatus further has an auxiliary room between the jig and the chamber, and the atmospheric pressure inside the auxiliary room is made lower than the outside air pressure before one of the substrates is conveyed into the auxiliary room and that substrate is conveyed into the processing room.

[18] The manufacturing method described in any one of [15] through [17], in which the carbon nanotube generation temperature is between 700° C. and 900° C.

[19] The manufacturing method described in any one of [15] through [18], in which the atmospheric pressure lower than the outside air pressure in step (3) is between 0.1 Torr and 0.6 Torr.

[20] The manufacturing method described in any one of [15] through [19], in which the source gas is a vapor of a substance that is a liquid at normal temperature.

[21] The manufacturing method described in any one of [15] through [20], in which the source gas is ethanol.

Advantageous Effects of Invention

According to the present invention, before electrodes are formed, an insulating protective film covering CNTs is formed, and a final protective film (plasma CVD film) that protects the device is formed by plasma CVD, enabling CNT-FETs stably exhibiting an excellent electrical conduction property to be manufactured with good reproducibility. Also, according to the present invention, a conductive film is formed between the insulating protective film and plasma CVD film, preventing damage to the CNTs due to plasma when the final protective film is formed by plasma CVD. Therefore, the present invention enables high-volume CNT-FET manufacture at high yields.

BRIEF DESCRIPTION OF DRAWINGS

FIG. 19 is a graph showing the relationship between processes of a CNT manufacturing method of the present invention and substrate temperature.

DESCRIPTION OF EMBODIMENTS

1. CNT-FET of the Present Invention

A CNT-FET manufactured by means of a manufacturing method of the present invention (hereinafter referred to as "CNT-FET of the present invention") has a semiconductor substrate having an insulating film (gate insulating film), CNTs (a channel) arranged on the insulating film, an insulating protective film covering the CNTs, a source electrode and drain electrode arranged on the insulating protective film, and a gate electrode. As explained later herein, from the standpoint of improving moisture resistance and mechanical strength, it is desirable for a CNT-FET of the present invention to further have a wiring protective film, conductive film, and plasma CVD film.

Figure 1A:
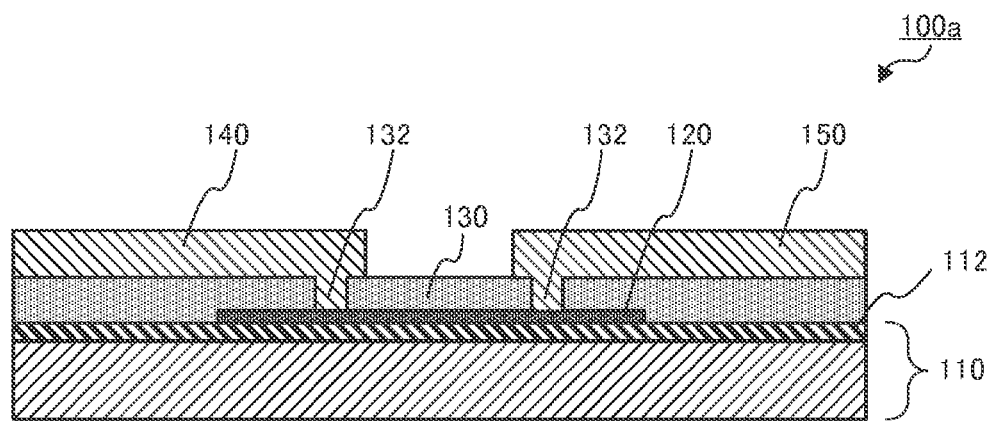
FIGS. 1A to 1B are cross-sectional views showing an example of a configuration of a CNT-FET of the present invention.
Figure 1B:
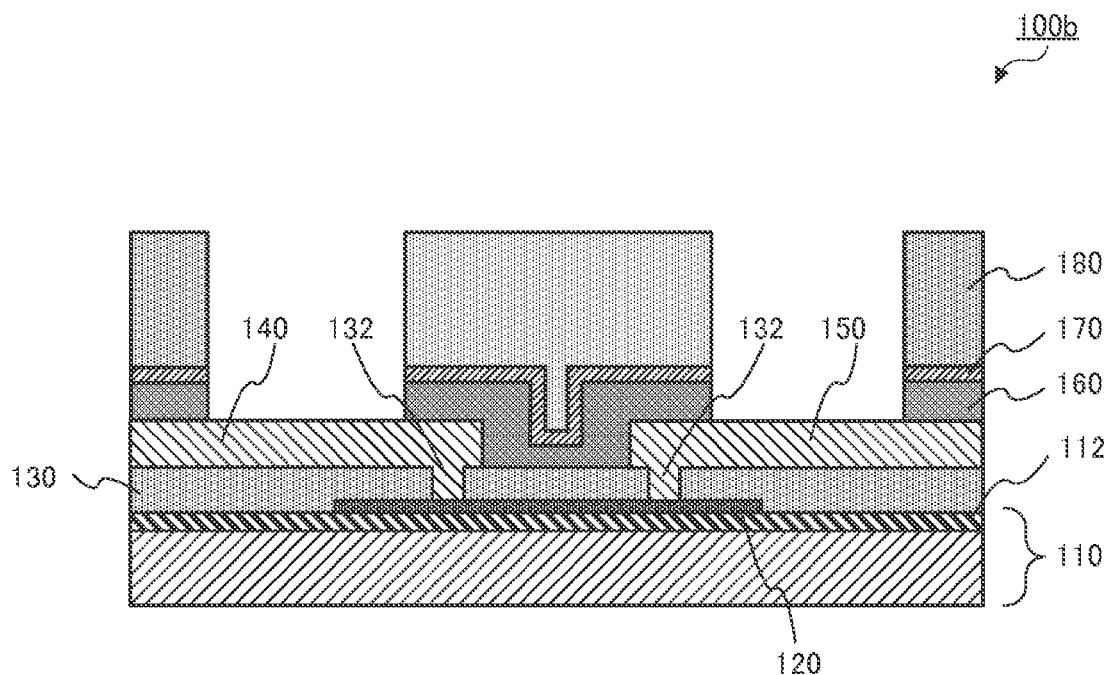

FIGS. 1A and 1B are cross-sectional views of CNT-FETs of the present invention for showing examples of the positional relationship of the CNTs (channel), the insulating protective film, and the source electrode and drain electrode. FIG. 1A is a cross-sectional view of a CNT-FET having a semiconductor substrate, CNTs (channel), insulating protective film, source electrode, drain electrode, and gate electrode (not shown). FIG. 1B is a cross-sectional view of a CNT-FET further having a wiring protective film, conductive film, and plasma CVD film.

In FIG. 1A, CNT-FET 100a has semiconductor substrate 110, CNTs 120 forming a channel, insulating protective film 130, source electrode 140, drain electrode 150, and a gate electrode (not shown). In FIG. 1B, in addition to semiconductor substrate 110, CNTs 120, insulating protective film 130, source electrode 140, drain electrode 150, and a gate electrode (not shown), CNT-FET 100b also has wiring protective film 160, conductive film 170, and plasma CVD film 180. In these examples, semiconductor substrate 110 has insulating film (gate insulating film) on one surface thereof. In these CNT-FETs 100a and 100b, a current flowing between source electrode 140 and drain electrode 150 is controlled by a voltage applied to a gate electrode (not shown).

As explained later herein, a feature of a CNT-FET manufacturing method of the present invention is that contact holes 132 are formed in insulating protective film 130 covering CNTs 120, exposing part of CNTs 120, and source electrode 140 and drain electrode 150 formed on insulating protective film 130 are electrically connected to CNTs 120 via those contact holes 132. Therefore, a feature of CNT-FETs 100 of the present invention is that source electrode 140 and drain electrode 150 are arranged on insulating protective film 130, so that source electrode 140 and drain electrode 150 are electrically connected to CNTs 120 via contact holes 132 formed in insulating protective film 130.

Members composing a CNT-FET of the present invention will now be described.

[Semiconductor Substrate]

A substrate included in a CNT-FET of the present invention is a semiconductor substrate, of which at least a surface on which a source electrode and drain electrode are arranged is covered with an insulating film (gate insulating film). There are no particular limitations on the material of the semiconductor substrate. Examples of semiconductor substrate material include group 14 elements such as silicon and germanium; III-V compounds such as gallium arsenic (GaAs) and indium phosphide (InP); and II-VI compounds such as zinc telluride (ZnTe). There are no particular limitations on the size and thickness of the semiconductor substrate. There are no particular limitations on the material of the insulating film, as long as it has insulating properties and high permittivity. Examples of insulating film material include inorganic compounds such as silicon oxide, silicon nitride, aluminum oxide, and titanium oxide; and organic compounds such as acrylic resins and polyimides. The insulating film may have a multilayered structure, such as a two-layered structure in which a silicon nitride film is stacked on a silicon oxide film, for example. There are no particular limitations on the thickness of the insulating film, as long as it is sufficient to secure insulating properties, and the thickness can be set as appropriate according to the position of the gate electrode, or the like. For example, when the insulating film has a two-layered structure in which a silicon nitride film is stacked on a silicon oxide film, it is desirable for the thickness of the silicon oxide film to be between 10 nm and 1,000 nm (for example, 80 nm), and it is desirable for the thickness of the silicon nitride film also to be between 10 nm and 1,000 nm (for example, 100 nm). The insulating film may cover only one surface of the semiconductor substrate (the surface on which the source electrode and drain electrode are arranged), or may cover both surfaces. The insulating film may cover the entire surface on which the source electrode and drain electrode are arranged, or may cover a part thereof (at least an area in which the CNTs, source electrode, and drain electrode are arranged).

[Channel]

In a CNT-FET of the present invention, a channel connecting the source electrode and drain electrode is composed of CNTs. The CNTs composing the channel may be either single-walled CNTs or multi-walled CNTs, but single-walled CNTs are preferable. The source electrode and drain electrode may be connected by one CNT, or may be connected by a plurality of CNTs. For example, the source electrode and drain electrode may be connected by a plurality of CNTs folded and laid over one another, or may be connected by a bundle of CNTS.

[Insulating Protective Film]

In a CNT-FET of the present invention, CNTs forming a channel are covered with an insulating protective film. There are no particular limitations on the material of the insulating protective film, as long as it has insulating properties. Examples of insulating protective film material include silicon oxide, silicon nitride, aluminum oxide, hafnium oxide, zirconium oxide, and titanium oxide. The insulating protective film may be formed only around the CNTs, or may be formed so as to cover all or part of the substrate surface on which the CNTs are arranged. There are no particular limitations on the thickness of the insulating protective film, as long as it is sufficient to completely cover (protect) the CNTs forming the channel, but a thickness of between 50 nm and 1,000 nm is desirable.

As stated above, contact holes for electrically connecting the source electrode or drain electrode to the CNTs are formed in the insulating protective film. There are no particular limitations on the positions of the contact holes, as long as the source electrode or drain electrode can be connected to the CNTs. For example, contact holes may be formed vertically with respect to the substrate surface at positions at which the source electrode or drain electrode and the CNTs overlap as viewed from above (see FIGS. 1A and 1B). There are no particular limitations on the distance between a contact hole for connecting the source electrode to the CNTs and a contact hole for connecting the drain electrode to the CNTs, but a distance of 10 µm or less is desirable. While a CNT may have a defect, even in this case there is a high possibility that a defect will not be included as long as its length is 10 µm or less. There are no particular limitations on the size (diameter) of the contact holes, as long as they are of sufficient size to electrically connect the source electrode and drain electrode to the CNTs.

[Source Electrode and Drain Electrode]

A source electrode and drain electrode are arranged on the insulating protective film of a CNT-FET of the present invention. There are no particular limitations on the material of the source electrode and drain electrode, as long as it is electrically conductive. Examples of the material of the source electrode and drain electrode include metals such as gold, platinum, chromium, titanium, aluminum, palladium, and molybdenum. The source electrode and drain electrode may have a multilayered structure comprising two or more kinds of metal, such as a structure in which a layer of gold is stacked on a layer of titanium, for example. There are no particular limitations on the shape of the source electrode and drain electrode, or the distance between them, and these can be set as appropriate according to a particular purpose.

As stated above, the source electrode and drain electrode are connected to the CNTs via respective contact holes formed in the insulating protective film. At this time, the source electrode and drain electrode may be connected only to a side surface of the CNTs (side-contact structure: see FIG. 9), may be connected only to an end surface (cross section) of the CNTs (end-contact structure: see FIG. 14), or may be connected to a side surface and end surface of the CNTs. As explained later herein, a side-contact-structure CNT-FET can be manufactured when only the insulating protective film is etched by means of wet etching when contact holes are formed in the insulating protective film, and an end-contact-structure CNT-FET can be manufactured when the CNTs as well as the insulating protective film are etched by dry etching.

[Gate Electrode]

As stated above, a CNT-FET of the present invention has a gate electrode. There are no particular limitations on the material of the gate electrode, as long as it is electrically conductive. Examples of gate electrode material include metals such as gold, platinum, chromium, titanium, brass and aluminum, and conductive plastics. The gate electrode is formed, for example, by vapor deposition of these metals at an arbitrary position. A separately prepared electrode (for example, a gold thin film) may also be arranged at an arbitrary position and used as a gate electrode. There are no particular limitations on the position at which the gate electrode is arranged, as long as a current flowing between the source electrode and drain electrode (the source-drain current) can be controlled by a gate electrode voltage, and the gate electrode can be arranged as appropriate according to a particular purpose. For example, a CNT-FET of the present invention can employ a top-gate type, side-gate type, or back-gate type mode according to the position of the gate electrode. That is to say, of the two sides of the semiconductor substrate, the gate electrode may be formed on the same side of the semiconductor substrate as the source electrode and drain electrode, or may be formed on the opposite side of the semiconductor substrate from where the source electrode and drain electrode are formed.

[Wiring Protective Film]

A CNT-FET of the present invention may also have a wiring protective film that covers (protects) the source electrode and drain electrode. The wiring protective film covers areas except areas where the source electrode and drain electrode are to be connected to external interconnections. There are no particular limitations on the material of the wiring protective film, as long as it has insulating properties. Examples of wiring protective film material include silicon oxide, silicon nitride, aluminum oxide, hafnium oxide, zirconium oxide, and titanium oxide. There are no particular limitations on the thickness of the wiring protective film, as long as it is sufficient to cover the source electrode and drain electrode, but a thickness of between 50 nm and 1,000 nm is desirable.

[Plasma CVD Film]

A CNT-FET of the present invention may also have a final protective film (plasma CVD film) formed by plasma CVD. Forming a final protective film improves the moisture resistance and mechanical strength of the CNT-FET. Also, using plasma CVD forms a final protective film with good adhesion quickly under low-pressure conditions. There are no particular limitations on the material of the final protective film, as long as it has insulating properties. One example of final protective film material is silicon nitride. There are no particular limitations on the thickness of the final protective film.

[Conductive Film]

When a CNT-FET of the present invention has a plasma CVD film, it is desirable to provide a conductive film between the insulating protective film and the plasma CVD film, preferably between the wiring protective film and the plasma CVD film. As explained later herein, this is to prevent damage to the CNTs when the plasma CVD film is formed. There are no particular limitations on the material of the conductive film as long as it is an electrically conductive substance (for example, a metal). Examples of conductive films include an aluminum film; a silicide film such as a tungsten silicide (WSi) film or a molybdenum silicide (MoSi) film; a silicon film; and a titanium film such as a titanium tungsten (TiW) film or titanium nitride (TiN) film. The conductive film may be formed so as to cover the entire substrate surface on which CNTs are arranged (see Embodiment 6), or may be formed so as to cover only an area in which CNTs are arranged (see Embodiment 7). When the conductive film covers only an area in which CNTs are arranged, it is desirable for the edge of the conductive film to be covered by the plasma CVD film. This is to prevent the flow of an unwanted current due to contact between the conductive film and a terminal. There are no particular limitations on the thickness of the conductive film, as long as it is sufficient to prevent damage to the CNTs, but a thickness between 10 nm and 1,000 nm is desirable.

2. CNT-FET Manufacturing Method of the Present Invention

A CNT-FET manufacturing method of the present invention includes (1) a first step of forming an insulating film on a semiconductor substrate, (2) a second step of arranging CNTs on the insulating film, (3) a third step of forming an insulating protective film covering the CNTs, and (4) a fourth step of forming a source electrode and a drain electrode.

Features of a CNT-FET manufacturing method of the present invention are (1) that an insulating protective film covering CNTs is formed after the CNTs have been arranged on a gate insulating film and before a source electrode and drain electrode are formed, and (2) that the source electrode and drain electrode are electrically connected to the CNTs via respective contact holes formed in the insulating protective film. Steps of "arranging of CNT", "gate electrode formation", and so forth, can be performed by appropriate application of conventional technology.

[Insulating Film Formation]

First, in the first step, an insulating film (gate insulating film) is formed on a semiconductor substrate. As explained later herein, when an etching solution containing hydrofluoric acid (HF) is used when contact holes are formed using wet etching, it is desirable for the insulating film to have a two-layered structure in which a silicon nitride film is stacked on a silicon oxide film. The reason for this is that the silicon nitride film functions as a wet etching stopper, and prevents the insulating film and semiconductor substrate from being etched. In this case, the silicon oxide film has a function of improving adhesion between the semiconductor substrate and the silicon nitride film.

[Arrangement of CNT]

In the second step, CNTs forming a channel are arranged on the prepared substrate insulating film. There are no particular limitations on the method of arranging CNTs on the substrate, and a heretofore known method can be used as appropriate. For example, by forming a plurality of catalyst layers for growing CNTs at arbitrary positions on the insulating film of the substrate and growing CNTs by means of CVD, CNTs can be formed so as to connect the catalyst layers. At this time, CNTs can be arranged at a position where the source electrode and drain electrode can be connected easily by forming catalyst layers so as to be positioned directly beneath an intended source electrode formation area and an intended drain electrode formation area. The CNTs may also be arranged on the substrate using a CNT manufacturing method of the present invention described later herein.

[Insulating Protective Film Formation]

In the third step, after CNTs have been arranged on the substrate, the CNTs on the substrate are covered with an insulating protective film. There are no particular limitations on the method of forming the insulating protective film, but a method that causes little thermal damage or chemical damage to the CNTs is desirable. Examples of such a method include catalytic CVD and ALD (Atomic Layer Deposition), which do not use plasma and require a low reaction temperature. With ALD, water molecules adsorbed to the CNTs can be removed in the film formation process, improving hysteretic characteristics of the CNT-FET. Also, with ALD, the insulating protective film is composed of thin monoatomic layers formed one at a time in a sequential manner, forming an insulating protective film that has good film uniformity and step coverage, and that not only covers the upper surface of the CNTs but wraps around and covers the lower surface as well.

There are no particular limitations on the material of the insulating protective film, as long as it has insulating properties. Examples of insulating protective film material include silicon oxide, silicon nitride, aluminum oxide, hafnium oxide, zirconium oxide, and titanium oxide. There are no particular limitations on the thickness of the insulating protective film, as long as it is sufficient to completely cover the CNTs forming the channel, but a thickness of between 50 nm and 1,000 nm is desirable.

As stated above, a feature of a manufacturing method of the present invention is that CNTs forming a channel are covered with an insulating protective film before proceeding to a process for forming a source electrode and drain electrode. Therefore, the CNTs forming the channel are protected physically and chemically in subsequent manufacturing processes. When a wiring protective film and a final protective film (plasma CVD film) are not formed, as described later herein, this insulating protective film can also function as a final protective film of an FET device.

[Formation of Source Electrode and Drain Electrode]

In the fourth step, a source electrode and drain electrode that are electrically connected to the CNTs via contact holes formed in the insulating protective film are formed on the insulating protective film. This fourth step is broadly divided into (1) a step of forming contact holes, and (2) a step of forming a source electrode and a drain electrode.

(1) Contact Hole Formation

After an insulating protective film covering the CNTs has been formed, substantially vertical contact holes are formed in the insulating protective film on the substrate surface, exposing part of the CNTs covered by the insulating protective film. These exposed sections of the CNTs form a source electrode connection section and a drain electrode connection section, and therefore at least two contact holes (for the source electrode and for the drain electrode) are formed. There are no particular limitations on the positions at which the contact holes are formed, as long as the source electrode and drain electrode can be connected to the CNTs, and these positions may be, for example, at the intended source electrode formation area and intended drain electrode formation area. There are no particular limitations on the distance between a contact hole for connecting the source electrode to the CNTs and a contact hole for connecting the drain electrode to the CNTs, but a distance of 10 μm or less is desirable. There are no particular limitations on the size (diameter) of the contact holes, as long as they are of sufficient size to enable the source electrode and drain electrode to be electrically connected to the CNTs.

There are no particular limitations on the contact hole formation method, and a heretofore known method such as wet etching or dry etching can be used as appropriate. For example, when the contact holes are formed by wet etching on an insulating protective film of silicon oxide, hafnium oxide, zirconium oxide, or the like, etching can be performed using an etching solution containing hydrofluoric acid after masking areas of the insulating protective film surface other than the intended contact hole formation areas with a resist film. At this time, when the substrate insulating film has a two-layered structure in which a silicon nitride film is stacked on a silicon oxide film, the silicon nitride film functions as a wet etching stopper, and therefore the insulating film and semiconductor substrate can be prevented from being etched. By performing wet etching in this way, insulating protective film is removed from areas not masked with a resist film (the intended contact hole formation areas), and the side surfaces of CNTs directly beneath these areas are exposed. Also, when contact holes are formed by dry etching, etching can be similarly performed after masking areas of the insulating protective film surface other than the intended contact hole formation areas with a resist film. When dry etching is performed, CNTs are also removed as well as insulating protective film in areas not masked with a resist film (the intended contact hole formation sites), and therefore a CNT end surface (cross section) is exposed on the side surface of the contact holes.

As stated above, when contact holes are formed using a method in which only the insulating protective film is etched, a CNT side surface is exposed inside the contact holes, whereas when contact holes are formed using a method in which the insulating protective film and CNTs are etched, a CNT end surface (cross section) is exposed inside the contact holes. This fact can be made use of to control formation of the connection between the source electrode and drain electrode and the CNTs. That is to say, when the source electrode and drain electrode are formed while a CNT side surface is exposed inside the contact holes, the source electrode and drain electrode will be connected only to the CNT side surface (side-contact structure); and when the source electrode and drain electrode are formed while a CNT end surface is exposed inside the contact holes, the source electrode and drain electrode will be connected only to the CNT end surface (cross section) (end-contact structure).

(2) Formation of Source Electrode and Drain Electrode

After contact holes have been formed in the insulating protective film, the source electrode and drain electrode are formed. At this time, the source electrode and drain electrode are formed so as to be able to be electrically connected to the CNTs via the respective contact holes. Examples of the material of the source electrode and drain electrode include metals such as gold, platinum, chromium, titanium, aluminum, palladium, and molybdenum. The source electrode and drain electrode may have a multilayered structure comprising two or more kinds of metal, such as a structure in which a layer of gold is stacked on a layer of titanium, for example. There are no particular limitations on the shape of the source electrode and drain electrode, or the distance between them, and these can be set as appropriate according to a particular purpose.

There are no particular limitations on the method of forming a source electrode and drain electrode in the intended electrode formation areas of the insulating protective film, and a heretofore known method can be used as appropriate. For example, a source electrode and drain electrode can be formed by masking areas of the insulating protective film surface other than the intended electrode formation areas with a resist film, depositing a metal such as gold, platinum, chromium, titanium, aluminum, palladium, or molybdenum, or a semiconductor such as poly-silicon, and removing (lifting off) the resist film. A source electrode and drain electrode can also be formed by depositing a metal such as gold, platinum, chromium, titanium, aluminum, palladium, or molybdenum, or a semiconductor such as poly-silicon, on the insulating protective film, and performing etching after masking the intended electrode formation areas with a resist film.

[Arrangement of Gate Electrode]

A gate electrode is arranged separately from the above-described first through fourth steps. There are no particular limitations on the method of arranging the gate electrode, and a heretofore known method can be used as appropriate. For example, a metal or the like can be deposited using photolithography as in the case of the source electrode and drain electrode. Also, when a separately prepared electrode is used as a gate electrode, that electrode can be arranged at a desired position.

As described above, in a manufacturing method of the present invention that includes the above first through fourth steps, an insulating protective film covering CNTs is formed before a source electrode and drain electrode are formed on a substrate, suppressing CNT defects and CNT contamination by a resist during the manufacturing process. A clean CNT channel created in this way exploits the one-dimensional conduction of CNTs to the maximum, and exhibits better FET characteristics than conventional CNT-FETs. Also, in a CNT-FET of the present invention manufactured in this way, CNTs are protected from adsorption of water molecules and the like by an insulating protective film, reducing a hysteretic characteristic. That is to say, according to a manufacturing method of the present invention, a CNT-FET of the present invention stably exhibiting an excellent electrical conduction property can be manufactured with good reproducibility, without using a special apparatus.

Examples of the manufacture of a CNT-FET of the present invention (not having a conductive film or plasma CVD film) by means of the above first through fourth steps are shown in Embodiments 1 through 5 described later herein.

In addition to the above first through fourth steps, a CNT-FET manufacturing method of the present invention may also have (5) a fifth step of forming a wiring protective film that protects the source electrode and drain electrode, (6) a sixth step of forming a conductive film on the wiring protective film, and (7) a seventh step of forming a plasma CVD film on the conductive film.

[Wiring Protective Film Formation]

In the fifth step, the source electrode and drain electrode are covered with a wiring protective film. Forming a wiring protective film protects the source electrode and drain electrode, and prevents the source electrode and drain electrode from coming into contact with the conductive film. There are no particular limitations on the method of forming the wiring protective film, but a method that causes little thermal damage or chemical damage to the CNTs is desirable. Examples of such a method include catalytic CVD and ALD.

There are no particular limitations on the material of the wiring protective film, as long as it has insulating properties. Examples of wiring protective film material include silicon oxide, silicon nitride, aluminum oxide, hafnium oxide, zirconium oxide, and titanium oxide. There are no particular limitations on the thickness of the wiring protective film, as long as it is sufficient to completely cover (protect) the CNTs forming the channel, but a thickness of between 50 nm and 1,000 nm is desirable.

[Conductive Film Formation]

In the sixth step, after the wiring protective film has been formed, a conductive film is formed on the wiring protective film. As explained below, forming a final protective film by plasma CVD improves the moisture resistance and mechanical strength of a CNT-FET. However, even if the CNTs are protected by an insulating protective film, if a final protective film is formed by plasma CVD, there is a risk of damaging the CNTs because of the high energy of plasma and electrons. In particular, with a CNT-FET, if the CNTs are damaged there is a risk of decreased performance as an FET, and furthermore of the CNT-FET becoming inoperative.

To avoid this, the present inventors have found that damage to CNTs due to plasma when a plasma CVD film is formed can be prevented by protecting the CNTs by forming a conductive film before forming a plasma CVD film in the seventh step. As can be seen from this, the conductive film functions as a protective film for protecting the CNTs from possible damages due to plasma. There are no particular limitations on the method of forming the conductive film. One example of a method of forming the conductive film is sputtering.

There are no particular limitations on the material of the conductive film as long as it is an electrically conductive substance (for example, a metal). Examples of conductive films include an aluminum film; a silicide film such as a tungsten silicide (WSi) film or a molybdenum silicide (MoSi)

film; a silicon film; and a titanium film such as a titanium tungsten (TiW) film or titanium nitride (TiN) film. The conductive film may be formed so as to cover the entire substrate surface on which CNTs are arranged, or may be formed so as to cover only an area in which CNTs are arranged. There are no particular limitations on the thickness of the conductive film, as long as it is sufficient to prevent damage to the CNTs, but a thickness between 10 nm and 1,000 nm is desirable.

[Plasma CVD Film Formation]

In the seventh step, after the conductive film has been formed, a final protective film (plasma CVD film) is formed on the wiring protective film and conductive film by plasma CVD. Forming a final protective film improves the moisture resistance and mechanical strength of a CNT-FET. Also, using plasma CVD forms a final protective film with good adhesion quickly under low-pressure conditions.

There are no particular limitations on the material of the final protective film, as long as it has insulating properties. Examples of final protective film material include silicon oxide, silicon nitride, aluminum oxide, hafnium oxide, zirconium oxide, and titanium oxide. There are no particular limitations on the thickness of the final protective film.

Thus, in a manufacturing method of the present invention that includes the above first through seventh steps, a wiring protective film and final protective film (plasma CVD film) are formed, further improving the moisture resistance and mechanical strength of a CNT-FET, in addition to the above-described effects. Also, in a manufacturing method of the present invention that includes the above first through seventh steps, a conductive film is formed before a final protective film is formed by plasma CVD, forming a final protective film with good adhesion quickly under low-pressure conditions, without damaging the CNTs.

Examples of the manufacture of a CNT-FET of the present invention by means of the above first through seventh steps are shown in Embodiments 6 and 7 described later herein.

High-volume industrial manufacture of CNT-FETs of the present invention can be performed as described below, for example.

First, a semiconductor substrate having an insulating film, of a size to enable the manufacture of a plurality of CNT-FETs of the present invention, is prepared. It is desirable for this semiconductor substrate to be substantially circular, and to have an orientation flat or notch. The following description assumes that a substantially circular semiconductor substrate having an orientation flat or notch has been prepared.

Next, the prepared semiconductor substrate is partitioned in a lattice shape, forming areas for forming CNT-FETs of the present invention. The number of CNT-FETs equals to the number of formed areas formed in one substrate.

At least two catalyst layers for growing CNTs are then formed in each of the areas partitioned in a lattice shape. There are no particular limitations on the positions at which the catalyst layers are formed, but it is desirable for them to be formed at positions within an intended source electrode formation area and intended drain electrode formation area as viewed from the upper surface of the substrate. This enables CNTs to be formed at a position where the source electrode and drain electrode are easily connected. It is also desirable for the positions at which catalyst layers are formed (that is, the positions of the intended source electrode formation area and intended drain electrode formation area) in each area to be the same, because this allows the relationships between a substrate orientation flat or notch and the positions of catalysts (intended formation areas for each electrode) in each area (that is, the direction of CNTs forming the channel) to be coordinated.

Next, the substrate on which catalyst layers have been formed is inserted into a CVD furnace, and CNTs are grown so as to connect between catalyst layers in each area of the substrate by means of chemical vapor deposition. If a plurality of substrates is placed in the CVD furnace, they can be placed by aligning their orientations using the substrate orientation flats or notches as a guide.

Subsequently, high-volume industrial manufacture of CNT-FETs of the present invention can be implemented by forming an insulating protective film, contact holes, a source electrode and drain electrode, and a gate electrode in each area in the same way as in the above-described method, followed by separation of the devices. The timing at which the devices are individualized (diced) is normally after the electrical characteristics of each device have been confirmed on a substrate unit basis, but is not limited to this.

In this way, high-volume industrial manufacture of CNT-FETs of the present invention can be implemented using semiconductor substrates generally available on the market.

Up to this point, a CNT-FET having a semiconductor substrate and a manufacturing method thereof have been described, but the present invention is not limited to this. For example, the same kind of effects can also be obtained when the present invention is applied to a thin film transistor (TFT) having CNTs as a channel.

Below, embodiments of an FET of the present invention are described with reference to the accompanying drawings, but the present invention is not limited to these embodiments. Embodiments 1 through 5 show examples of a CNT-FET of the present invention that does not have a conductive film or plasma CVD film, while Embodiments 6 and 7 show examples of a CNT-FET of the present invention that has a conductive film and plasma CVD film.

(Embodiment 1)

Embodiment 1 shows an example of a back-gate type CNT-FET that has an insulating film (gate insulating film) on both surfaces of a semiconductor substrate.

Figure 2:
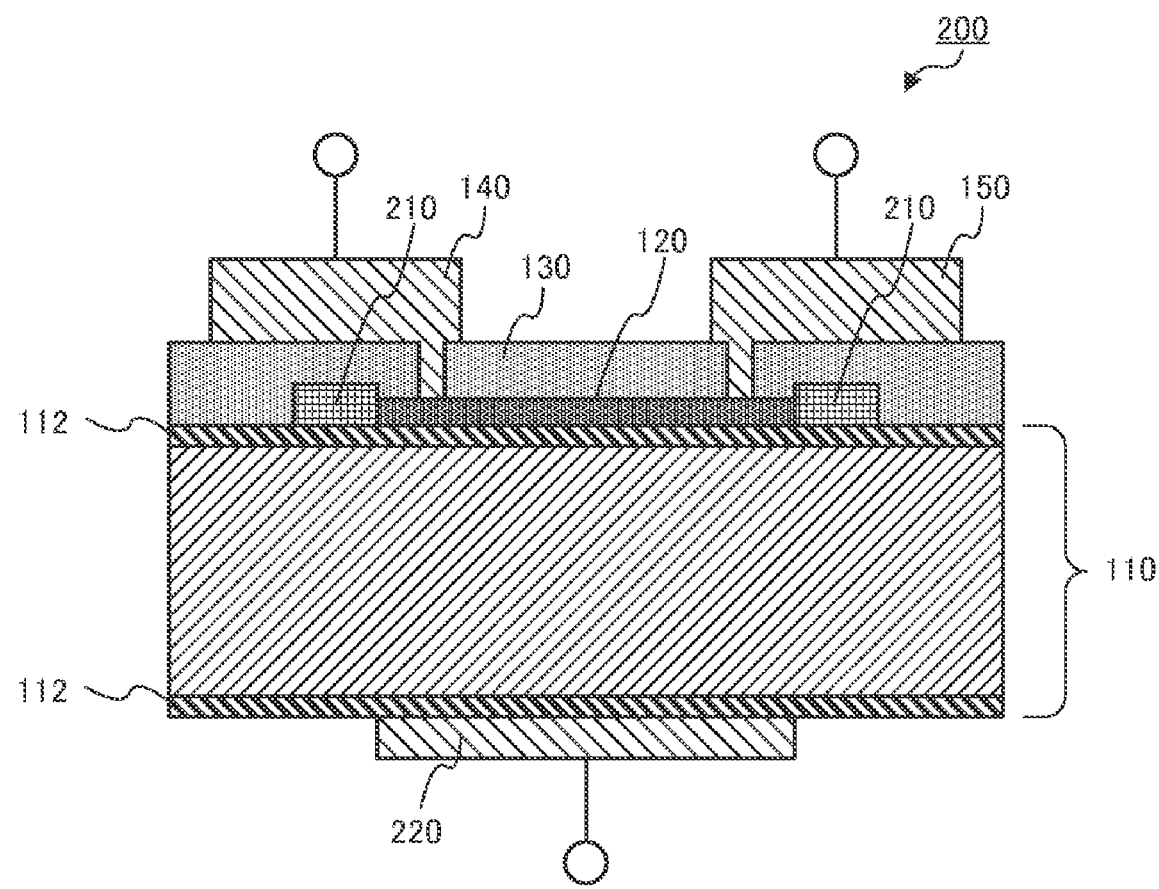
FIG. 2 is a cross-sectional view showing the configuration of a CNT-FET of Embodiment 1.

FIG. 2 is a cross-sectional view showing the configuration of a CNT-FET according to Embodiment 1 of the present invention. In FIG. 2, CNT-FET 200 has semiconductor substrate 110, CNTs 120, insulating protective film 130, source electrode 140, drain electrode 150, catalyst layers 210, and gate electrode 220.

Semiconductor substrate 110 is a substrate made of a semiconductor, both surfaces of which are covered with insulating film 112. Insulating film 112 may have a multilayered structure, such as a two-layered structure in which a silicon nitride film is stacked on a silicon oxide film, for example.

CNTs 120 are arranged on insulating film 112 of semiconductor substrate 110. CNTs 120 are electrically connected to source electrode 140 and drain electrode 150, and function as a channel of CNT-FET 200. As described later herein, CNTs 120 are formed by chemical vapor deposition, and are therefore in contact with catalyst layers 210. Source electrode 140 and drain electrode 150 may be connected by one CNT 120, or may be connected by a plurality of CNTs 120, as shown in FIG. 2.

Insulating protective film 130 is an insulating film covering CNTs 120. In this embodiment, insulating protective film 130 not only covers CNTs 120, but widely covers a surface of semiconductor substrate 110 on which CNTs 120 are arranged, and also covers catalyst layers 210 arranged on the same surface. Contact holes for electrically connecting source electrode 140 and drain electrode 150 to CNTs 120 are formed in insulating protective film 130 in an area directly beneath source electrode 140 and drain electrode 150 and in which CNTs 120 are arranged.

Source electrode 140 and drain electrode 150 are arranged on insulating protective film 130, and are electrically connected to CNTs 120 via respective contact holes formed in insulating protective film 130. Source electrode 140 and drain electrode 150 may be connected only to a side surface of CNTs 120 as shown in FIG. 2 (side-contact structure), or may be connected to an end surface (end-contact structure).

Gate electrode 220 is arranged on insulating film 112 of the surface of semiconductor substrate 110 (the surface facing downward in FIG. 2) which is opposite to the surface on which CNTs 120 are arranged (the surface facing upward in FIG. 2). This gate electrode 220 forms a metal-insulator-semiconductor (MIS) structure together with insulating film (gate insulating film) 112 and semiconductor substrate 110. A current flowing between source electrode 140 and drain electrode 150 (the source-drain current) can be controlled by applying a voltage to gate electrode 220.

As described above, in CNT-FET 200 of Embodiment 1, CNTs 120 are protected from adsorption of water molecules and so forth by insulating protective film 130, reducing a hysteretic characteristic.

Figure 3:
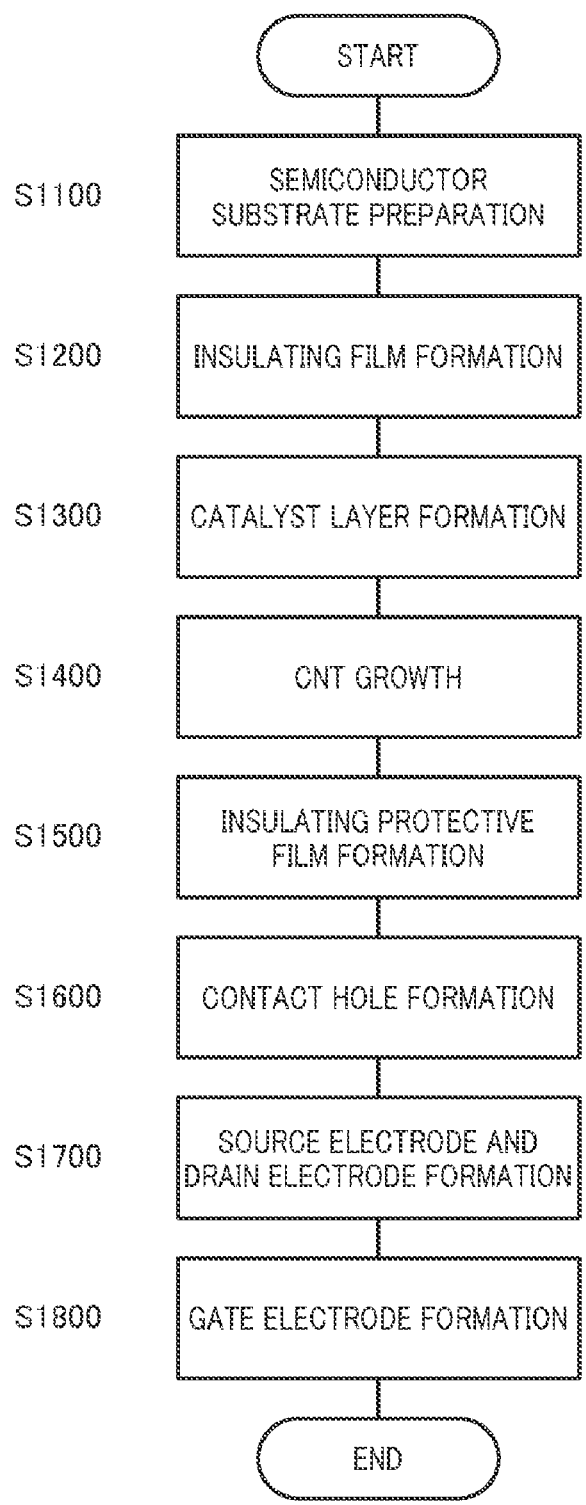
FIG. 3 is a flowchart showing the manufacturing method of a CNT-FET of Embodiment 1.

The method of manufacturing CNT-FET 200 of this embodiment will now be described with reference to the flowchart in FIG. 3 and the cross-sectional views in FIGS. 4A to 4H.

First, in step S1100, semiconductor substrate 110, which is a mirror-polished silicon substrate or the like, is prepared.

Figure 4A:
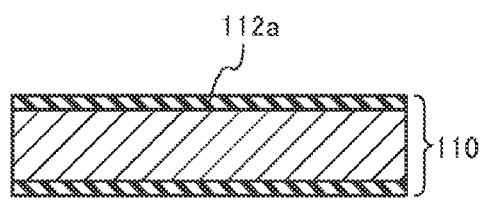
FIGS. 4A to 4H are cross-sectional views showing the manufacturing method of a CNT-FET of Embodiment 1.
Figure 4B:
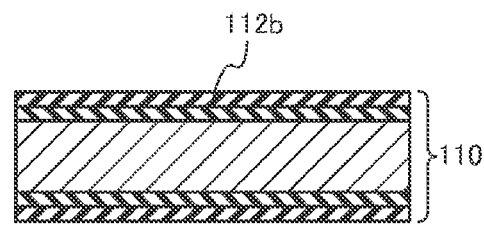

Next, in step S1200, insulating film 112 is formed on both surfaces of prepared semiconductor substrate 110. For example, a mirror-polished silicon substrate can be heated in the atmosphere and a silicon oxide film (insulating film 112a) is formed on both surfaces of the silicon substrate (semiconductor substrate 11(0), after which a silicon nitride film (insulating film 112b) is formed on the silicon oxide film by means of low-pressure CVD. FIG. 4A is a schematic diagram showing semiconductor substrate (silicon substrate) 110 after silicon oxide film 112a has been formed on both surfaces. FIG. 4B is a schematic diagram showing semiconductor substrate (silicon substrate) 110 after silicon nitride film 112b has further been formed on silicon oxide film 112a. Thus, insulating film 112 may have a two-layered structure in which silicon nitride film 112b is stacked on silicon oxide film 112a.

Figure 4C:
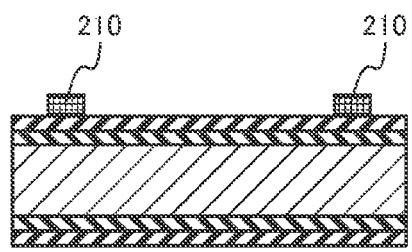

Then, in step S1300, catalyst layers 210 for growing CNTs 120 forming a channel are formed on insulating film 112 of semiconductor substrate 110. There are no particular limitations on the positions at which catalyst layers 210 are formed, as long as CNTs 120 are able to grow to connect source electrode 140 and drain electrode 150, and these positions can be within an area forming source electrode 140 and an area forming drain electrode 150, for example. Catalyst layers 210 can be formed, for example, by forming a silicon thin film, aluminum thin film, metal thin film, and molybdenum thin film, in that order, on insulating film 112 using sputtering, and then performing etching. FIG. 4C is a schematic diagram showing the situation after two catalyst layers 210 have been formed on insulating film 112 (silicon nitride film 112b).

Figure 4D:
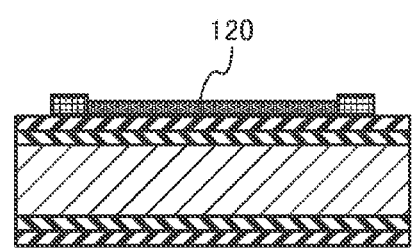

Next, in step S1400, CNTs 120 are grown from catalyst layers 210. There are no particular limitations on the method of growing CNTs 120, and low-pressure CVD can be used, for example. At this time, it is desirable to crosslink catalyst layers 210 by one or a plurality of CNTs 120. FIG. 4D is a schematic diagram showing the situation after CNTs 120 have been grown from catalyst layers 210.

Figure 4E:
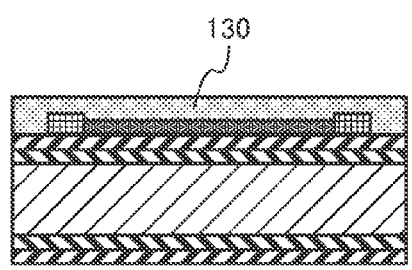

Then, in step S1500, insulating protective film 130 is formed so as to cover grown CNTs 120. For example, insulating protective film 130 of silicon oxide can be formed on semiconductor substrate 110 on which CNTs 120 have been grown by means of catalytic CVD. FIG. 4E is a schematic diagram showing the situation after insulating protective film 130 has been formed on the entire surface of semiconductor substrate 110 on which CNTs 120 are arranged.

Figure 4F:
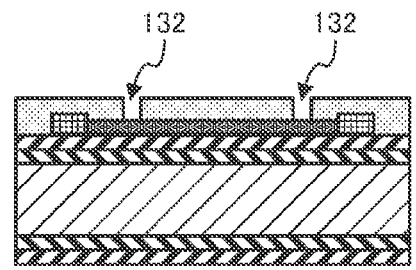

Next, in step S1600, contact holes 132 are formed in an intended source electrode formation area and an intended drain electrode formation area of insulating protective film 130, exposing part of CNTs 120. For example, wet etching can be performed using an etching solution containing hydrofluoric acid after masking areas of the surface of silicon oxide insulating protective film 130 other than the intended contact hole 132 formation areas with a resist film. At this time, if substrate insulating film 112 has a two-layered structure in which silicon nitride film 112b is stacked on silicon oxide film 112a, silicon nitride film 112b functions as a wet etching stopper, and therefore semiconductor substrate 110 can be prevented from being etched. By performing wet etching in this way, insulating protective film 130 is removed from areas not masked with a resist film (the intended contact hole 132 formation areas), and side surfaces of CNTs directly beneath these areas are exposed. FIG. 4F is a schematic diagram showing the situation after contact holes 132 have been formed in an intended source electrode 140 formation area and an intended drain electrode 150 formation area of insulating protective film 130.

Figure 4G:
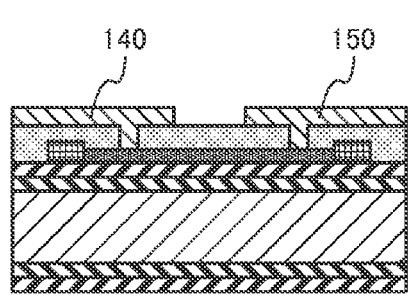

Then, in step S1700, source electrode 140 and drain electrode 150 are formed on insulating protective film 130 so as to be electrically connected to CNTs 120 via respective contact holes 132. For example, source electrode 140 and drain electrode 150 can be formed by forming an aluminum thin film on insulating protective film 130 using sputtering, and then performing etching. FIG. 4G is a schematic diagram showing the situation after source electrode 140 and drain electrode 150 have been formed. In this example, source electrode 140 and drain electrode 150 are formed while a CNT 120 side surface is exposed, and therefore source electrode 140 and drain electrode 150 are connected only to the CNT 120 side surface (side-contact structure).

Figure 4H:
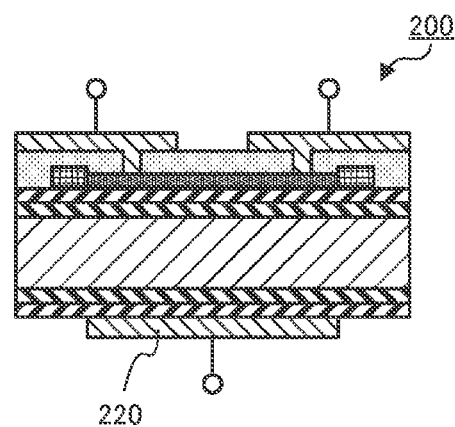

Finally, in step S1800, gate electrode 220 is formed on insulating film 112 on the surface of semiconductor substrate 110 on which CNTs 120 are not arranged. For example, gate electrode 220 can be formed by forming an aluminum thin film on insulating film 112 (silicon nitride film 112b) using sputtering, and then performing etching. FIG. 4H is a schematic diagram showing CNT-FET 200 of Embodiment 1 after gate electrode 220 has been formed.

As described above, in the manufacturing method of Embodiment 1, insulating protective film 130 covering CNTs 120 forming a channel is formed before proceeding to the step for forming source electrode 140 and drain electrode 150 (S1700), enabling CNTs 120 to be physically and chemically protected in the step of forming source electrode 140 and drain electrode 150. As a result, the manufacturing method of Embodiment 1 enables a CNT-FET having a clean CNT channel that exploits the one-dimensional conduction of CNTs to the maximum to be manufactured.

(Embodiment 2)

Embodiment 2 shows an example of a back-gate type CNT-FET that additionally has a wiring protective film.

Figure 5:
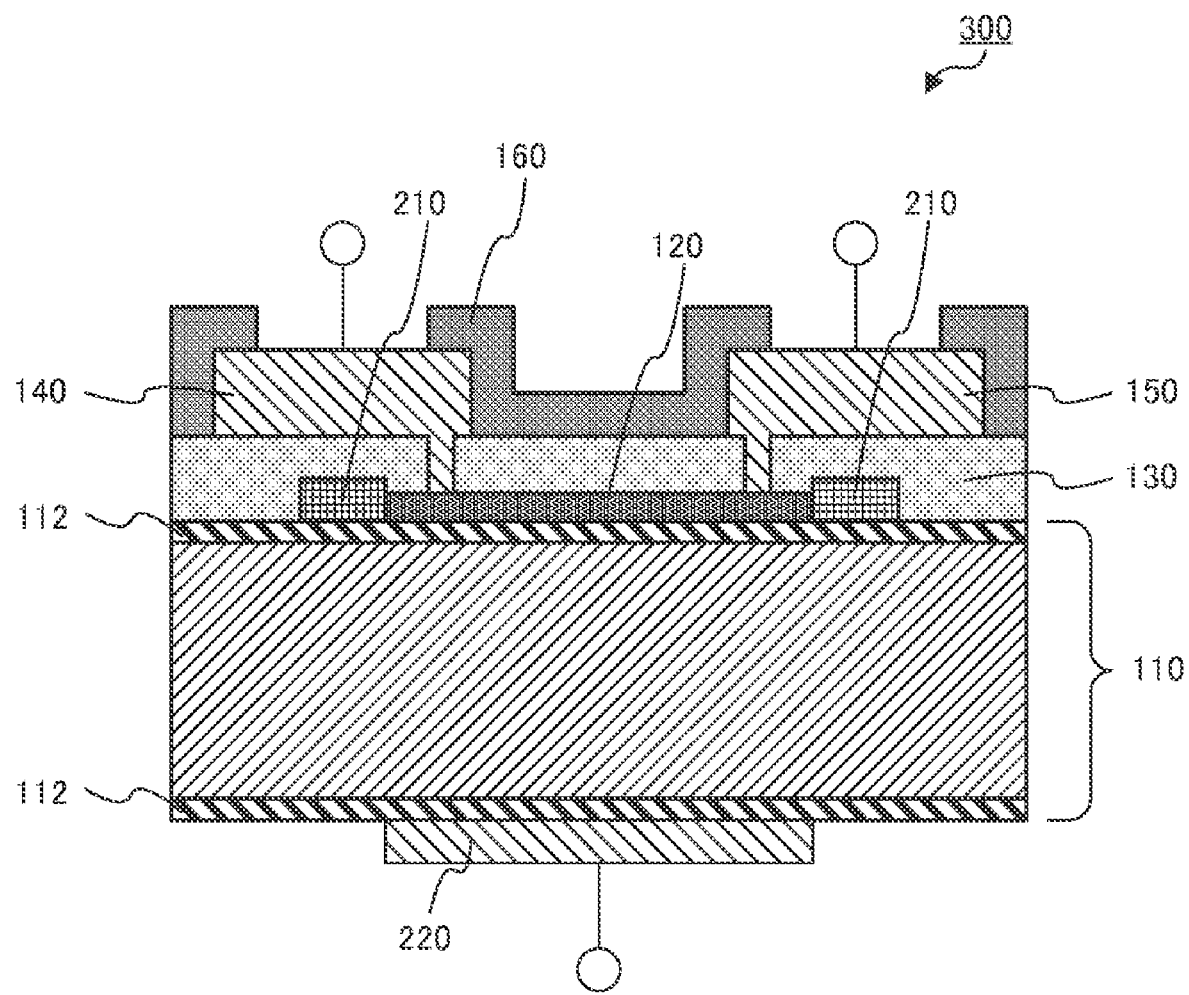
FIG. 5 is a cross-sectional view showing the configuration of a CNT-FET of Embodiment 2.

FIG. 5 is a cross-sectional view showing the configuration of a CNT-FET according to Embodiment 2 of the present invention. In FIG. 5, CNT-FET 300 has semiconductor substrate 110, CNTs 120, insulating protective film 130, source electrode 140, drain electrode 150, catalyst layers 210, gate electrode 220, and wiring protective film 160. Elements identical to those of a CNT-FET according to Embodiment 1 are assigned the same reference codes as in Embodiment 1, and duplicate descriptions thereof are omitted here.

Wiring protective film 160 is an insulating film that covers insulating protective film 130 and parts of source electrode 140 and drain electrode 150. There are no particular limitations on the method of forming wiring protective film 160, and, for example, after a CNT-FET of Embodiment 1 has been created, an insulating film can be formed on insulating protective film 130 together with source electrode 140 and drain electrode 150, and etching can be performed so that parts of source electrode 140 and drain electrode 150 are exposed.

Since a CNT-FET of Embodiment 2 has wiring protective film 160 that can also function as a sealing film, its characteristics can be further stabilized in addition to the provision of the effects of Embodiment 1.

(Embodiment 3)

Whereas Embodiments 1 and 2 showed examples of back-gate type CNT-FETs having an insulating film (gate insulating film) on both surfaces of a semiconductor substrate, Embodiment 3 shows an example of a back-gate type CNT-FET having an insulating film (gate insulating film) on only one surface of a semiconductor substrate.

Figure 6:
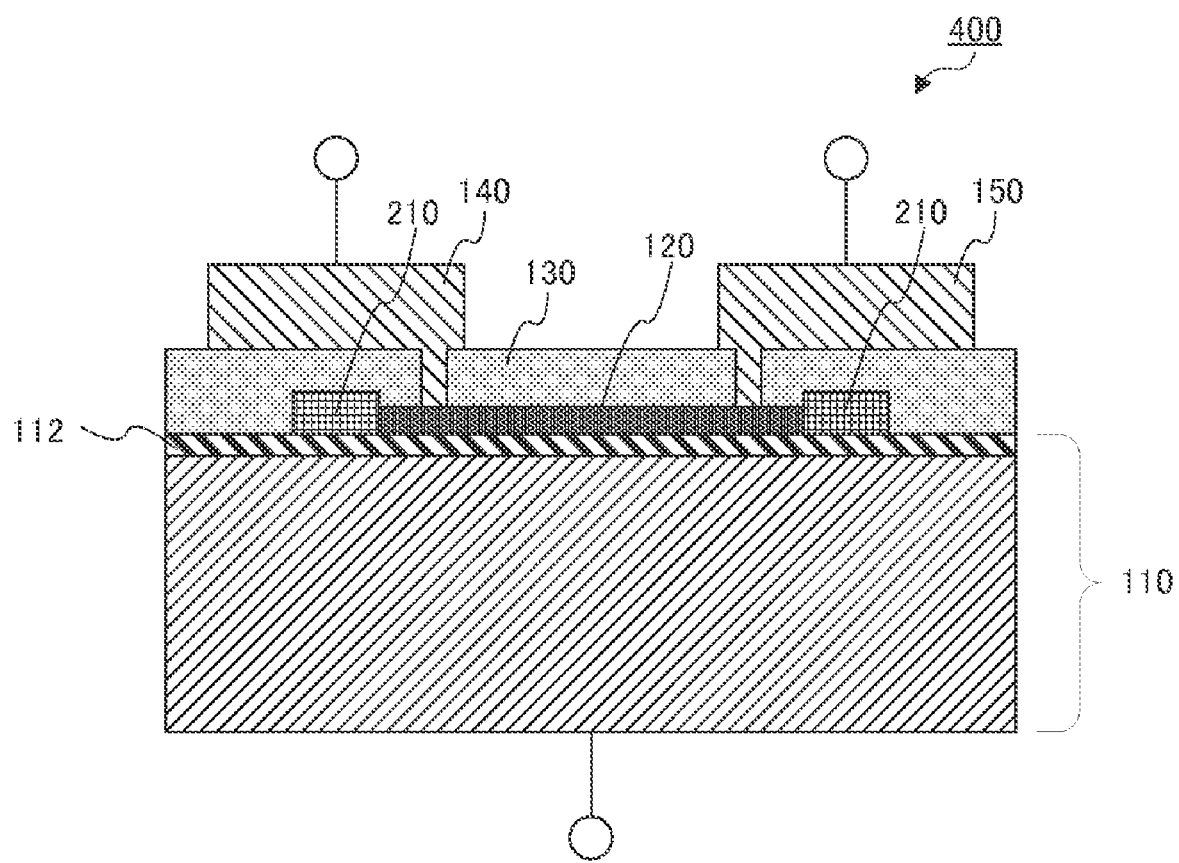
FIG. 6 is a cross-sectional view showing the configuration of a CNT-FET of Embodiment 3.

FIG. 6 is a cross-sectional view showing the configuration of a CNT-FET according to Embodiment 3 of the present invention. In FIG. 6, CNT-FET 400 has semiconductor substrate 110, CNTs 120, insulating protective film 130, source electrode 140, drain electrode 150, and catalyst layers 210. Elements identical to those of a CNT-FET according to Embodiment 1 are assigned the same reference codes as in Embodiment 1, and duplicate descriptions thereof are omitted here.

Semiconductor substrate 110 is a substrate made of a semiconductor, of which only the surface on which CNTs 120 are arranged (the surface facing upward in FIG. 6) is covered with insulating film 112. Insulating film 112 may have a multilayered structure, such as a two-layered structure in which a silicon nitride film is stacked on a silicon oxide film, for example. Since the surface on which CNTs 120 are not arranged (the surface facing downward in FIG. 6) is not covered with an insulating film, in CNT-FET 400 of Embodiment 3 the semiconductor part of semiconductor substrate 110 functions directly as a gate electrode. There are no particular limitations on the method of covering only one surface of semiconductor substrate 110 with insulating film 112, and, for example, one of the insulating films formed on both surfaces of semiconductor substrate 110 can be removed.

As described above, with a CNT-FET of Embodiment 3 a part of semiconductor substrate 110 made of a semiconductor is made to function directly as a gate electrode, so that a gate voltage can be applied effectively in addition to providing the effects of Embodiment 1.

(Embodiment 4)

Whereas Embodiments 1 through 3 showed examples of back-gate type CNT-FETs, Embodiment 4 shows examples of side-gate type CNT-FETs.

Figure 7A:
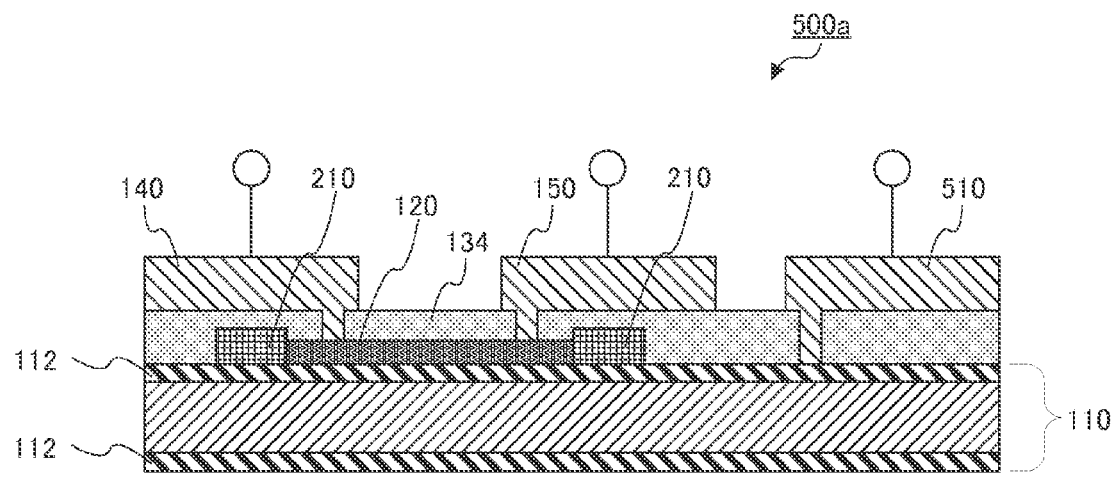
FIGS. 7A and 7B are cross-sectional views showing configurations of a CNT-FET of Embodiment 4.
Figure 7B:
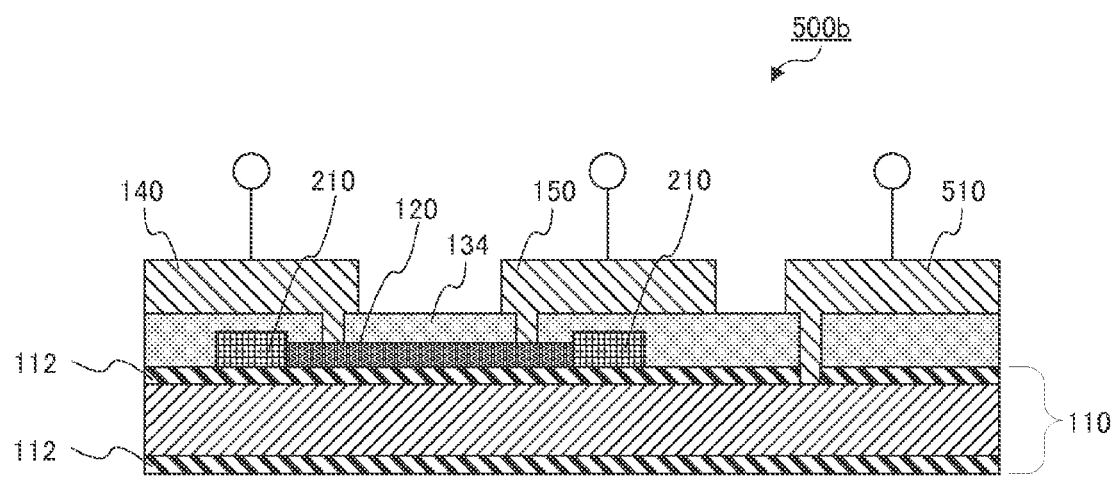

FIGS. 7A and 7B are cross-sectional views showing configuration of CNT-FETs of Embodiment 4. In FIG. 7A and FIG. 7B, CNT-FETs 500a and 500b have semiconductor substrate 110, CNTs 120, insulating protective film 134, source electrode 140, drain electrode 150, catalyst layers 210, and gate electrode 510. Elements identical to those of a CNT-FET according to Embodiment 1 are assigned the same reference codes as in Embodiment 1, and duplicate descriptions thereof are omitted here.

Insulating protective film 134 is an insulating film covering CNTs 120 in the same way as an insulating protective film of Embodiments 1 through 3, but have not only contact holes for source electrode 140 and drain electrode 150 formed therein, but also a contact hole for gate electrode 510.

Gate electrode 510 is arranged on insulating protective film 134, and is connected to semiconductor substrate 110 via a contact hole formed in insulating protective film 134. Gate electrode 510 may be formed so as to be connected to insulating film (gate insulating film) 112 of semiconductor substrate 110 as shown in FIG. 7A, or may be formed so as to be connected to a part of semiconductor substrate 110 made of a semiconductor as shown in FIG. 7B. A current flowing between source electrode 140 and drain electrode 150 can be controlled by applying a voltage to gate electrode 510.

CNT-FETs 500a and 500b of this embodiment can be manufactured by means of almost the same procedure as CNT-FET 200 of Embodiment 1. That is to say, when contact holes are formed in insulating protective film 134 (see step S1600 in FIG. 3), not only contact holes for the source electrode and drain electrode, but also a contact hole for the gate electrode, are formed, and when gate electrode 510 is formed (see step S1800 in FIG. 3), gate electrode 510 is formed over the contact hole for the gate electrode.

As described above, in CNT-FETs 500a and 500b of Embodiment 4, CNTs 120 are protected from adsorption of water molecules and so forth by insulating protective film 134, in the same way as in a CNT-FET of Embodiment 1, reducing a hysteretic characteristic.

Also, since CNT-FETs 500a and 500b of this embodiment do not use the rear surface of a semiconductor substrate as an electrode, these CNT-FETs can be manufactured without concern for the state of the rear surface of the semiconductor substrate. With a back-gate type CNT-FET, the rear surface of the semiconductor substrate is used as an electrode, and therefore if the insulating film (gate insulating film) on the rear surface (the surface in contact with a stage) is scratched or contaminated when the semiconductor substrate is processed after being placed on a stage or the like, there is a possibility of the yield falling. On the other hand, with the side-gate type CNT-FETs of Embodiment 4, the rear surface of the semiconductor substrate functions only as a supporting substrate, and therefore the yield will not fall even if the rear surface of the semiconductor substrate is scratched or contaminated.

(Embodiment 5)

Embodiment 5 shows an example of a side-gate type CNT-FET having a diffusion layer within a semiconductor substrate.

Figure 8:
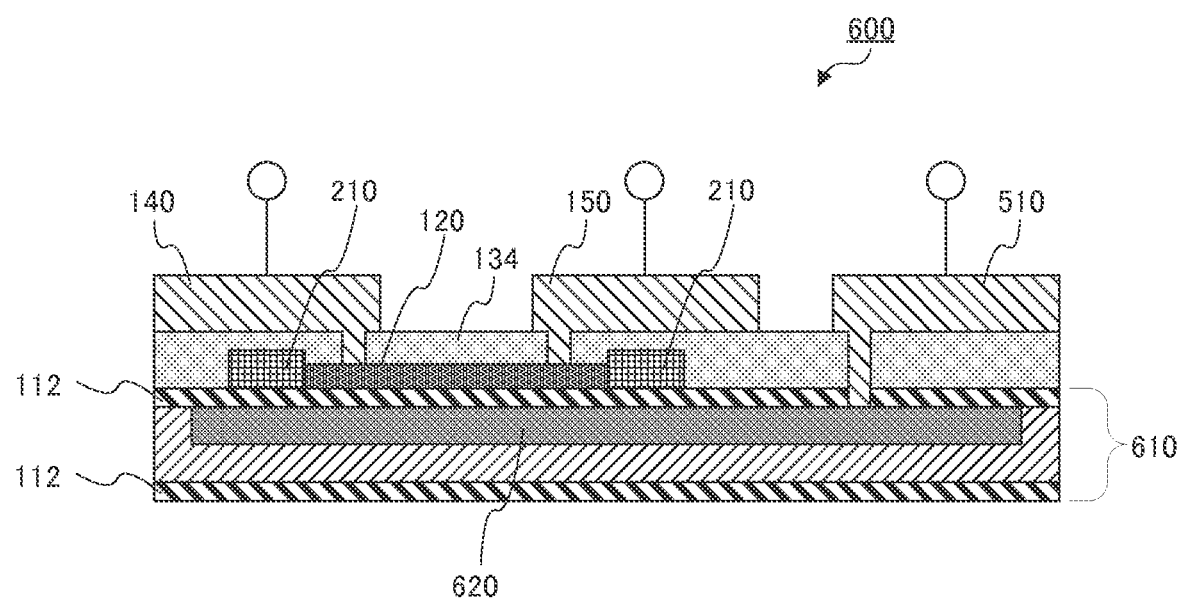
FIG. 8 is a cross-sectional view showing the configuration of a CNT-FET of Embodiment 5.

FIG. 8 is a cross-sectional view showing the configuration of a CNT-FET of Embodiment 5 of the present invention. In FIG. 8, CNT-FET 600 has semiconductor substrate 610, CNTs 120, insulating protective film 134, source electrode 140, drain electrode 150, catalyst layers 210, and gate electrode 510. Elements identical to those of a CNT-FET according to Embodiment 4 are assigned the same reference codes as in Embodiment 4, and duplicate descriptions thereof are omitted here.

CNTs 120 exhibit an n-type electrical conduction property, and function as an n-type channel of CNT-FET 600. There are no particular limitations on the method of manufacturing a channel exhibiting an n-type electrical conduction property, and, for example, insulating protective film 134 can be made as a silicon nitride film (see JP-A No. 2006-222279, for example).

Semiconductor substrate 610 is a substrate made of an n-type semiconductor, and has insulating film (gate insulating film) 112 on its rear surface. Also, semiconductor substrate 610 has p-type diffusion layer 620 in an area on the side on which CNTs 120 are arranged. As a method of manufacturing a semiconductor substrate having a p-type diffusion layer, a heretofore known method such as ion injection can be used as appropriate.

In this embodiment, an example of a configuration comprising an n-type semiconductor substrate having a p-type diffusion layer, and an n-type channel, has been shown, but the same kind of effect can also be obtained with a configuration comprising a p-type semiconductor substrate having an n-type diffusion layer, and a p-type channel.

As CNT-FET 600 of Embodiment 5 has a diffusion layer directly beneath the CNTs, CNT sensitivity improves, in addition to providing the effects of Embodiment 4. For example, if an antibody is immobilized on the gate electrode and a CNT-FET is used as a biosensor, a CNT-FET of this embodiment enables an antibody (detection target substance) to be detected with high sensitivity because the CNT sensitivity (the current change rate with respect to an antigen-antibody reaction taken place on the gate electrode) is high. Also, with CNT-FET 600 of this embodiment, the CNT sensitivity characteristic can be adjusted by adjusting the impurity concentration of the diffusion layer.

(Embodiment 6)

Embodiment 6 shows an example of a back-gate type CNT-FET that additionally has a wiring protective film, conductive film, and plasma CVD film.

Figure 9:
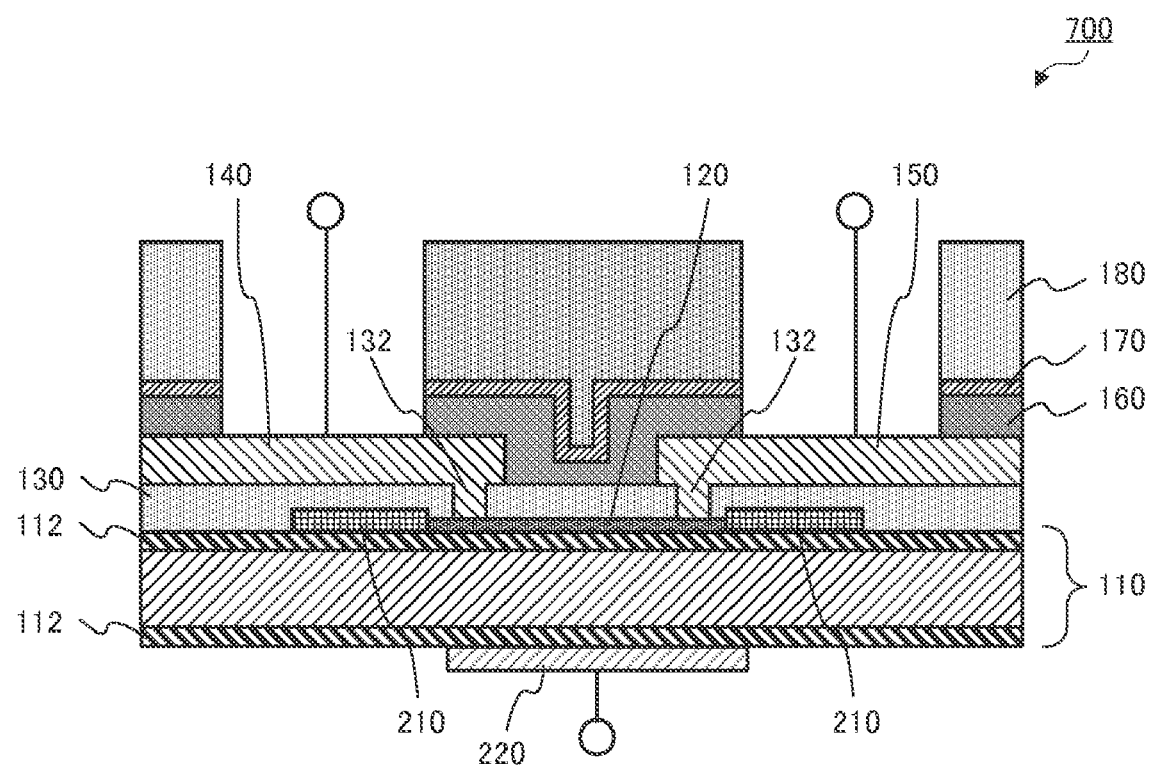
FIG. 9 is a cross-sectional view showing the configuration of a CNT-FET of Embodiment 6.

FIG. 9 is a cross-sectional view showing the configuration of a CNT-FET according to Embodiment 6 of the present invention. In FIG. 9, CNT-FET 700 has semiconductor substrate 110, CNTs 120, insulating protective film 130, source electrode 140, drain electrode 150, catalyst layers 210, gate electrode 220, wiring protective film 160, conductive film 170, and plasma CVD film 180. Elements identical to those of a CNT-FET according to Embodiment 1 are assigned the same reference codes as in Embodiment 1, and duplicate descriptions thereof are omitted here.

Wiring protective film 160 is an insulating film that covers insulating protective film 130 and parts of source electrode 140 and drain electrode 150. In this embodiment, wiring protective film 160 covers areas except areas the source electrode and drain electrode are to be connected to external interconnections. Wiring protective film 160 is, for example, a film of an insulator such as silicon oxide or silicon nitride. The thickness of wiring protective film 160 is between 50 nm and 1,000 nm, for example.

Conductive film 170 is a metal film formed between wiring protective film 160 and plasma CVD film 180. In this embodiment, conductive film 170 is formed so as to cover the entire surface of wiring protective film 160. Conductive film 170 is a film of a metal such as aluminum or titanium, for example. The thickness of conductive film 170 is between 10 nm and 1,000 nm, for example.

Plasma CVD film 180 is an insulating film formed on conductive film 170 by plasma CVD. In this embodiment, plasma CVD film 180 is formed so as to cover the entire surface of conductive film 170 (wiring protective film 160). Plasma CVD film 180 is a film of silicon nitride or the like, for example. There are no particular limitations on the thickness of plasma CVD film 180.

According to this embodiment, by providing conductive film 170, possible damages to CNTs that occur when plasma CVD film 180 is formed and that cannot be adequately prevented only by insulating protective film 130 can be prevented in advance. CNTs are particularly susceptible to damage by plasma, and CNT-FET performance degrades greatly if CNTs used as a channel are damaged. While also enabling an effect of preventing damage to elements other than CNTs to be obtained, conductive film 170 more particularly enables an extremely large effect to be obtained for a CNT-FET. Therefore, according to this embodiment, yield can be improved when performing high-volume industrial manufacture of CNT-FETs using plasma CVD.

Figure 10:
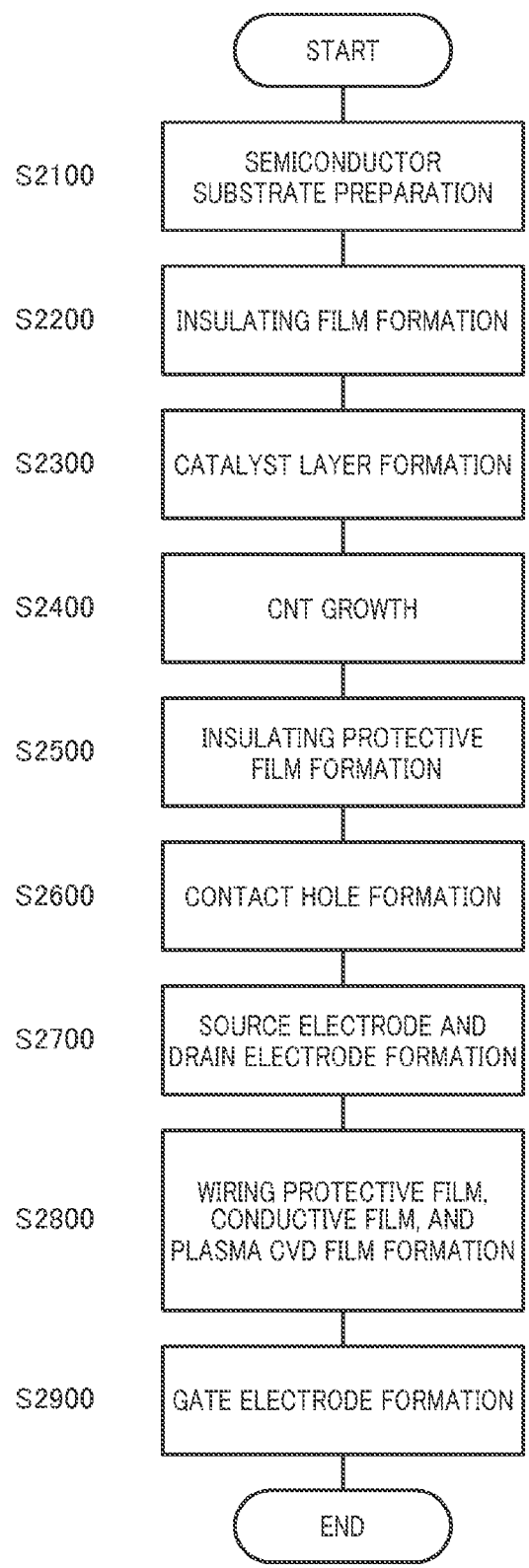
FIG. 10 is a flowchart showing the manufacturing method of a CNT-FET of Embodiment 6.

The method of manufacturing CNT-FET 700 of this embodiment will now be described with reference to the flowchart in FIG. 10 and the cross-sectional views in FIGS. 11A to 11I.

First, in step S2100, semiconductor substrate 110, which is a mirror-polished silicon substrate or the like, is prepared.

Figure 11A:
FIGS. 11A to 11I are cross-sectional views showing the manufacturing method of a CNT-FET of Embodiment 6.

Next, in step S2200, insulating film (gate insulating film) 112 is formed on both surfaces of prepared semiconductor substrate 110. For example, a silicon oxide film (insulating film 112) can be formed on both surfaces of the silicon substrate (semiconductor substrate 110) by means of thermal oxidation processing. FIG. 11A is a schematic diagram showing semiconductor substrate (silicon substrate) 110 after insulating film (silicon oxide film) 112 has been formed on both surfaces.

Figure 11B:
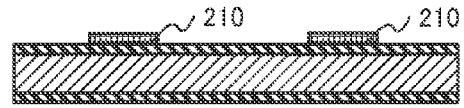

Then, in step S2300, metallic catalyst layers 210 for growing CNTs 120 forming a channel are formed at predetermined positions on insulating film 112. For example, catalyst layers 210 can be formed by (1) forming a silicon film on the entire surface of insulating film 112, (2) removing portions of the silicon film at positions where catalyst layers 210 are to be formed, using hydrogen fluoride or the like, (3) performing vapor deposition of aluminum, iron, molybdenum, or the like in areas from which the silicon layers have been removed, and (4) forming catalyst layers 210 by removing the surrounding silicon films. FIG. 11B is a schematic diagram showing the situation after two catalyst layers 210 have been formed on insulating film 112.

Figure 11C:
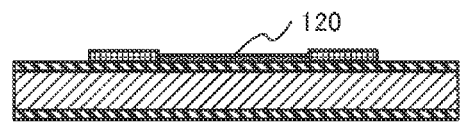

Next, in step S2400, CNTs 120 are grown from catalyst layers 210. There are no particular limitations on the method of growing CNTs 120, and low-pressure CVD can be used, for example. FIG. 11C is a schematic diagram showing the situation after CNTs 120 have been grown from catalyst layers 210.

Figure 11D:
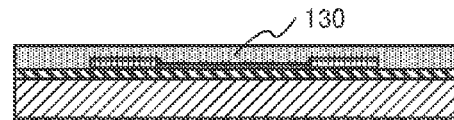

Then, in step S2500, insulating protective film 130 is formed so as to cover grown CNTs 120. For example, insulating protective film 130 of silicon oxide or silicon nitride can be formed by means of CVD. FIG. 11D is a schematic diagram showing the situation after insulating protective film 130 has been formed on the entire surface of semiconductor substrate 110 on which CNTs 120 are arranged.

Figure 11E:
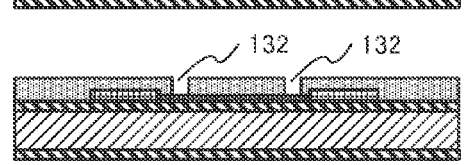

Next, in step S2600, contact holes 132 are formed in an intended source electrode formation area and an intended drain electrode formation area of insulating protective film 130, exposing part of CNTs 120. For example, wet etching can be performed using an etching solution containing hydrofluoric acid after masking areas of the surface of silicon oxide insulating protective film 130 other than the intended contact hole 132 formation areas with a resist film. By performing wet etching in this way, insulating protective film 130 is removed from areas not masked with a resist film (the intended contact hole 132 formation areas), and side surfaces of CNTs directly beneath these areas are exposed. FIG. 11E is a schematic diagram showing the situation after contact holes 132 have been formed in an intended source electrode 140 formation area and an intended drain electrode 150 formation area of insulating protective film 130.

Figure 11F:
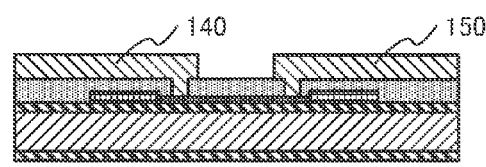

Then, in step S2700, source electrode 140 and drain electrode 150 are formed on insulating protective film 130 so as to be electrically connected to CNTs 120 via respective contact holes 132. For example, source electrode 140 and drain electrode 150 can be formed by forming a thin aluminum film on insulating protective film 130 by sputtering, and then performing photo-etching. FIG. 11F is a schematic diagram showing the situation after source electrode 140 and drain electrode 150 have been formed.

Figure 11G:
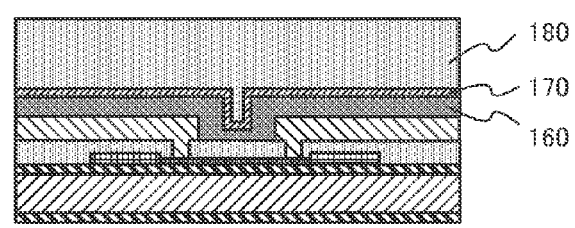
Figure 11H:
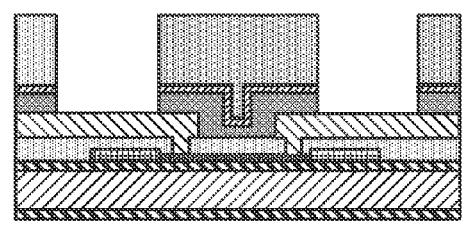

Next, in step S2800, wiring protective film 160, conductive film 170, and plasma CVD film 180 are sequentially formed. This can be done, for example, by (1) forming wiring protective film 160 made of an insulator such as silicon oxide or silicon nitride on source electrode 140 and drain electrode 150 using CVD, (2) forming conductive film 170 of a metal such as aluminum or titanium on wiring protective film 160 by sputtering, (3) forming a plasma CVD film of silicon nitride by plasma CVD, and (4) exposing parts (areas to be connected to external terminals) of source electrode 140 and drain electrode 150 by means of photo-etching. FIG. 11G is a schematic diagram showing the situation after wiring protective film 160, conductive film 170, and plasma CVD film 180 have been formed on the entire surface of semiconductor substrate 110 on which CNTs 120 are arranged. FIG. 11H is a schematic diagram showing the situation after parts (areas to be connected to terminals) of source electrode 140 and drain electrode 150 have been exposed.

Figure 11I:
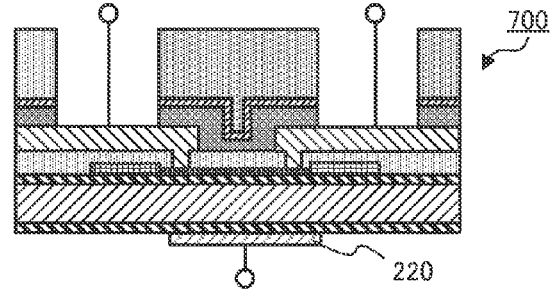

Finally, in step S2900, gate electrode 220 is formed on insulating film 112 on the surface of semiconductor substrate 110 on which CNTs 120 are not arranged. FIG. 11I is a schematic diagram showing CNT-FET 700 of Embodiment 6 after gate electrode 220 has been formed.

Figure 12A:
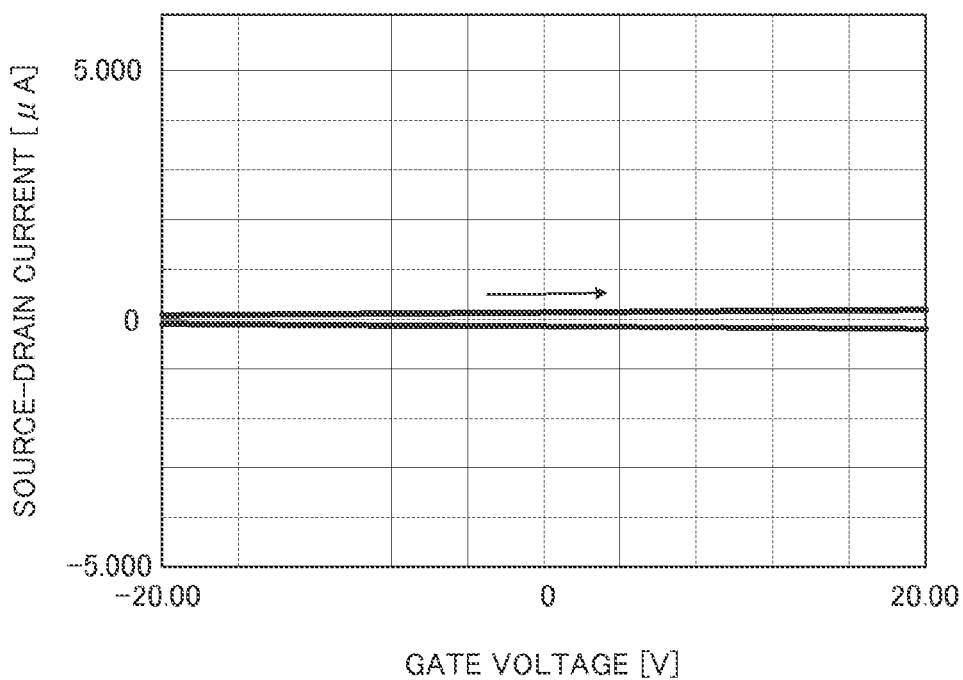
FIGS. 12A and 12B are graphs of source-drain current vs. gate voltage of a CNT-FET.
Figure 12B:
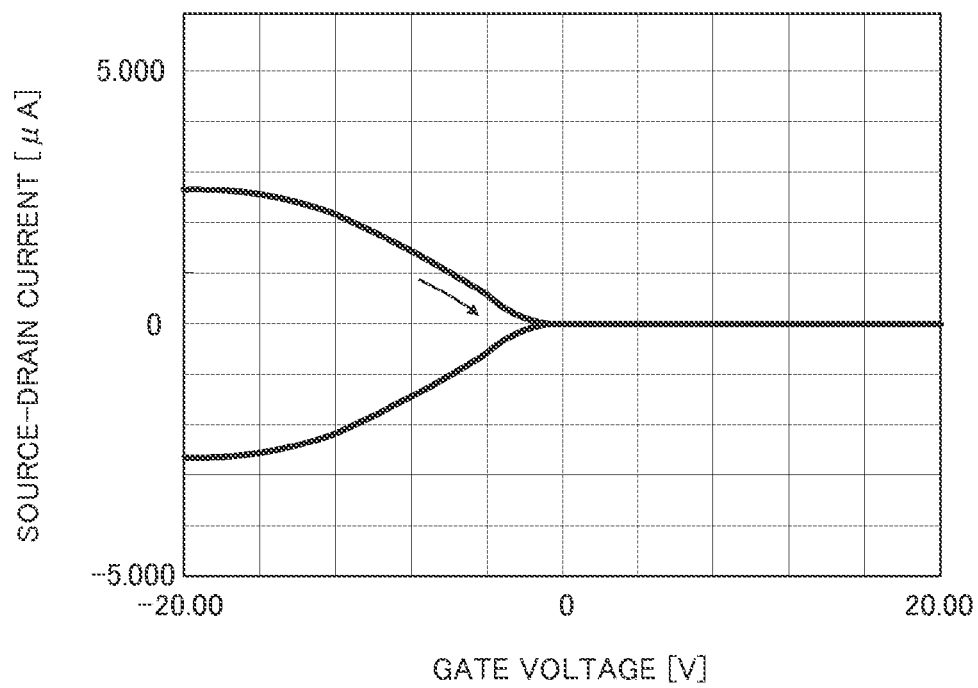
Figure 13:
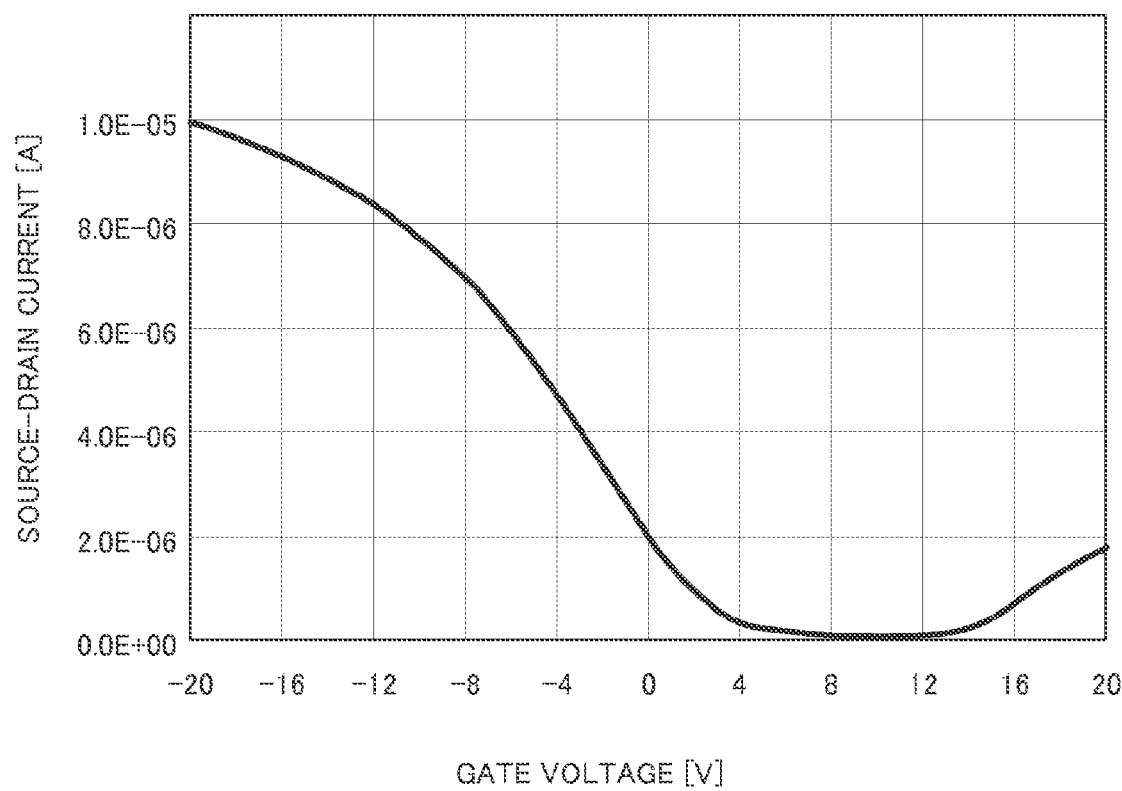
FIG. 13 is a graph of source-drain current vs. gate voltage of a CNT-FET.

FIGS. 12A, 12B and 13 show graphs of the relationship between a gate voltage and source-drain current of a CNT-FET. FIG. 12A is a graph showing a characteristic of a CNT-FET in which a conductive film has not been formed but a plasma CVD film has been formed, and FIG. 2B and FIG. 13 are graphs showing characteristics of a CNT-FET in which a plasma CVD film has been formed after a conductive film has been formed (a CNT-FET of this embodiment).

From the graph in FIG. 12A, it can be seen that, even though CNTs 120 are protected by insulating protective film 130, CNTs are damaged when plasma CVD film 180 is formed, and the source-drain current cannot be controlled by changing the gate voltage. On the other hand, from the graphs in FIG. 12B and FIG. 13, it can be seen that forming conductive film 170 beforehand enables the source-drain current to be controlled by changing the gate voltage even after plasma CVD film 180 has been formed. That is to say, it can be seen that forming conductive film 170 beforehand has prevented damage to the CNTs.

As described above, in the manufacturing method of Embodiment 6, conductive film 170 protecting CNTs 120 forming a channel is formed before a final protective film (plasma CVD film 18(0) is formed by plasma CVD, enabling CNTs 120 to be protected in the step of forming plasma CVD film 180. As a result, the manufacturing method of Embodiment 6 enables a CNT-FET having a CNT channel that exploits the CNT's one-dimensional conductivity to the maximum to be manufactured.

(Embodiment 7)

Embodiment 7 shows an example of a back-gate type CNT-FET that has a conductive film only on an area in which CNTs are arranged.

Figure 14:
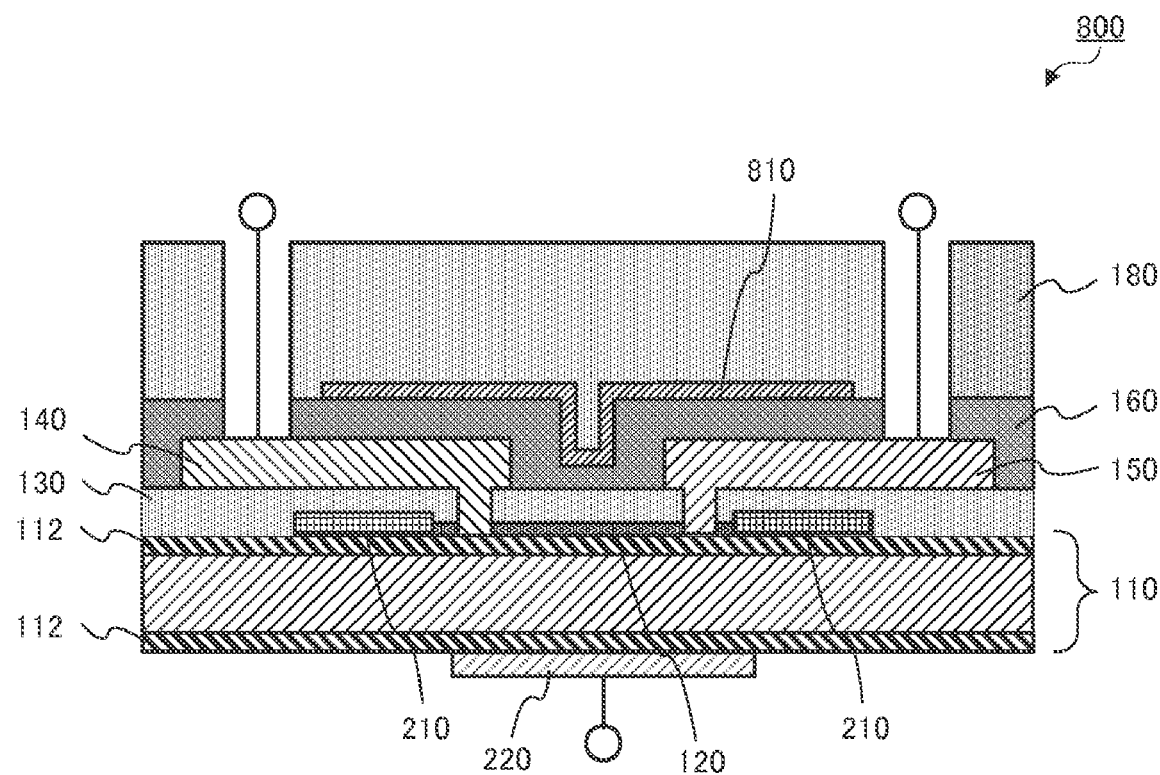
FIG. 14 is a cross-sectional view showing the configuration of a CNT-FET of Embodiment 7.

FIG. 14 is a cross-sectional view showing the configuration of a CNT-FET according to Embodiment 7 of the present invention. In FIG. 14, CNT-FET 800 has semiconductor substrate 110, CNTs 120, insulating protective film 130, source electrode 140, drain electrode 150, catalyst layers 210, gate electrode 220, wiring protective film 160, conductive film 810, and plasma CVD film 180. Elements identical to those of a CNT-FET according to Embodiment 6 are assigned the same reference codes as in Embodiment 6, and duplicate descriptions thereof are omitted here.

In this embodiment, conductive film 810 does not cover the entire surface of wiring protective film 160, but is formed on an area that covers an area on which CNTs 120 are arranged. Also, the edges of conductive film 810 are completely covered by plasma CVD film 180. This prevents the flow of an unwanted current due to contact between conductive film 810 and a terminal.

Figure 15A:
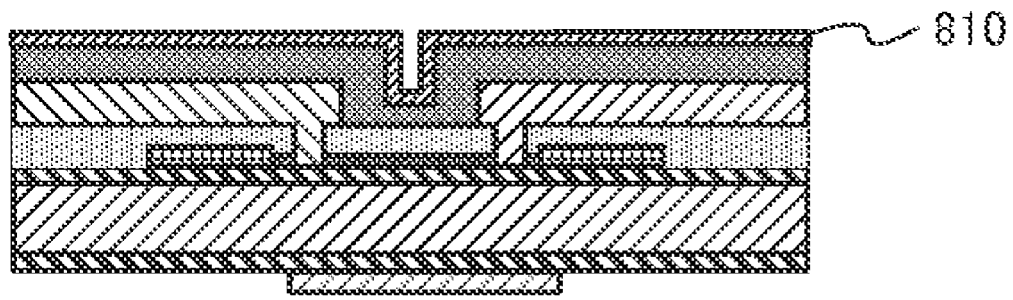
FIGS. 15A and 15B are cross-sectional views showing the manufacturing method of a CNT-FET of Embodiment 7.
Figure 15B:
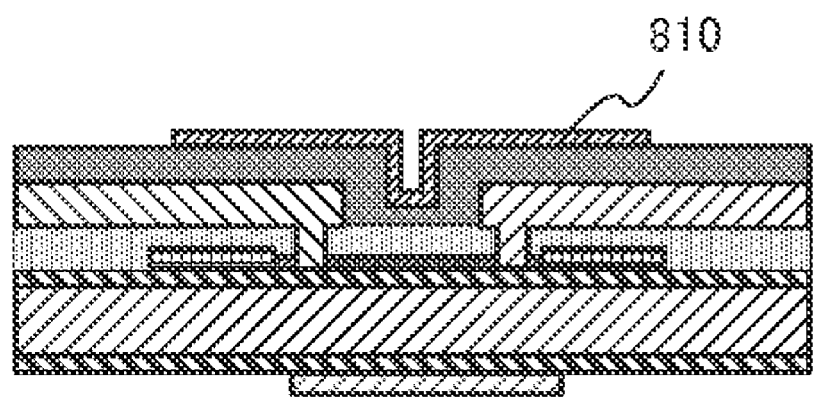

There are no particular limitations on the method of forming conductive film 810 only in a specific area. For example, this can be done, as shown in FIGS. 15A and 15B, by (1) forming conductive film 810 on the entire surface of wiring protective film 160 by means of sputtering (see FIG. 15A), and (2) removing conductive film 810 from areas other than an area in which CNTs 120 are arranged by means of wet etching (see FIG. 5B).

3. CNT Manufacturing Method of the Present Invention

As described above, when manufacturing a CNT-FET of the present invention, CNTs may be grown on a substrate.

CNT manufacturing methods are broadly divided into three kinds: arc discharge, laser vapor deposition, and CVD. In a CNT manufacturing method using CVD, CNTs are grown by reaction with a source gas containing carbon atoms in the presence of a transition metal catalyst. The transition metal catalyst may be arranged on a substrate or the like. For example, a CNT manufacturing method using CVD is known in which the raw material is alcohol gas (Chemical Physics Letters, Vol. 360, p. 229-234; J. Phys. Chem. B, Vol. 108, p. 16451-16456; Surface Science, Vol. 25, No. 6, p. 318-32(5). In any literature, a CNT is grown on a substrate by inserting a substrate on which a metal catalyst (iron-based) is arranged into a quartz tube; reducing pressure inside the quartz tube and heating it to between approximately 600° C. and 900° C.; and introducing alcohol into the quartz tube. On the other hand, a technology has been reported whereby a CNT array is created by performing CNT vapor deposition on a wafer (JP-A No. 2007-161576).

CVD is generally considered to be suitable for high-volume production since the raw material is a gas. CVD can be made still more applicable to industrial production by using a gas of a substance that is a liquid at normal temperature as a raw material. However, conventional CNT manufacture by means of CVD is manufacture on a so-called laboratory-level scale, and is difficult to apply to an industrial scale. Thus, a CNT manufacturing method of the present invention will be described that enables high-quality CNTs to be manufactured on an industrial scale. A CNT manufacturing method of the present invention can, of course, be used when manufacturing CNT-FETs of the present invention.

A feature of a CNT manufacturing method of the present invention is that CNTs are vapor-deposited using a low-pressure CVD apparatus on a substrate on a planar surface on which a catalyst has been arranged. That is to say, a CNT in the present invention is formed on a substrate on which a catalyst for CNT vapor deposition has been arranged.

There are no particular limitations on the type of the substrate, but when a low-pressure CVD apparatus used in a semiconductor manufacturing process is applied, it is desirable for the substrate to be a semiconductor wafer. A semiconductor wafer is a substantially circular disc manufactured by slicing an ingot obtained by crystal growth of a semiconductor substance in a cylindrical shape with a diameter on the order of approximately 120 mm to 200 mm into slices between approximately 0.5 mm and 1.5 mm in thickness. An example of a semiconductor substance is silicon.

A catalyst for CNT vapor deposition from a source gas containing carbon atoms is arranged on the planar surface of the substrate. There are no particular limitations on the type of catalyst, but suggested options are particles of iron, cobalt, nickel, or an alloy of these. The catalyst can be patterned on the substrate by means of sputtering.

The planar surface of the substrate may be divided into a plurality of areas by being partitioned in a lattice shape. Then chips of a plurality of CNT devices (such as CNT-FETs) can be obtained from one substrate by providing the catalyst in each of the plurality of areas.

As with a general semiconductor wafer, it is desirable for a substrate used in the present invention to have an orientation flat or notch. The orientation flat or notch enables the semiconductor crystal orientation to be known.

There are no particular limitations on the source gas for CNT vapor deposition, as long as it contains carbon atoms. Examples of such a gas include a saturated hydrocarbon gas such as methane, ethane, or propane, and a non-saturated hydrocarbon gas such as ethylene or acetylene. It is desirable for the source gas to be a substance that is a liquid at normal temperature (approximately 25° C.) and a gas at between 0.1 Torr and 0.6 Torr, because liquidity at normal temperature allows a highly pure raw material to be easily acquired, and also ensures a high level of safety. An example of a desirable source gas is ethanol.

As described later herein, before a CNT source gas is introduced into a processing room in which a substrate on which a catalyst has been formed has been arranged, a reduction gas is introduced. A reduction gas can activate a catalyst formed on a planar surface of a substrate. An example of the reduction gas is hydrogen gas. An inert gas may also be introduced together with the reduction gas, in order to dilute the reduction gas. Examples of an inert gas include nitrogen gas and argon gas.

A CNT manufacturing method of the present invention can be implemented using a low-pressure CVD apparatus widely used in a semiconductor manufacturing process. Low-pressure CVD apparatuses are broadly divided into a batch type (see FIG. 16 and FIG. 17), and a single type (see FIG. 18). Batch-type apparatuses are classified as horizontal (see FIG. 16) or vertical (see FIG. 17) according to the orientation of the chamber.

A batch-type low-pressure CVD apparatus has a chamber. The chamber is generally a tubular member made of quartz. Inside the chamber, a processing room for processing a substrate (including forming CNTs on the substrate) is arranged. The chamber of a batch-type low-pressure CVD apparatus may be installed horizontally (the axial direction of the tube being horizontal), or may be installed vertically (the axial direction of the tube being vertical).

A batch-type low-pressure CVD apparatus has a gas introduction section for introducing gas into the processing room of the chamber. Gases introduced into the processing room are a reduction gas, inert gas, or the like, as well as a CNT source gas. The source gas is ethanol or the like.

A batch-type low-pressure CVD apparatus also has an exhaust section for discharging gas that is inside the processing room of the chamber. Discharging gas enables pressure inside the processing room to be reduced, reducing the pressure to between 0.1 Torr and 0.6 Torr, for example. Reducing the pressure to between 0.1 Torr and 0.6 Torr achieves more thorough discharging of air (oxygen and other impurities in the air) inside the chamber, eliminates outside-air factors, and enables CNTs to be manufactured in a state of higher cleanliness.

On the other hand, if pressure reduction is insufficient (for example, 5 to 10 Torr), the volume of volatilization of the source gas (ethanol or the like) during vapor deposition increases, resulting in an excessive rise in the CNT cross-linking rate. In this case, there may be a high probability of cross-linking of a plurality of CNTs including metallic CNTs, and a decrease in the yield of a target CNT-FET in which the source and drain electrodes are linked by a single SWCNT.

It is desirable to provide a heater around the chamber of a batch-type low-pressure CVD apparatus. The heater can adjust the temperature of a substrate placed inside the processing room. When the CNT source gas is introduced, it is desirable for the substrate temperature inside the processing room to be between 700° C. and 900° C., in order to achieve efficient CNT formation. Also, the atmospheric pressure in the processing room, into which a substrate is conveyed, is reduced to a pressure lower than the outside air pressure.

When a batch-type low-pressure CVD apparatus is used, a jig charged with a plurality of substrates is conveyed into the processing room. It is desirable for the plurality of substrates arranged on the jig to be separated from each other, and for the substrate surfaces on which a catalyst has been arranged to be placed parallel to each other. More specifically, it is desirable for substrates to be approximately 6 mm from each other.

Moreover, it is desirable for the plurality of substrates on the jig to be placed in the processing room so that their planar surfaces and the axial direction of the tube of the chamber are perpendicular to each other. That is to say, since the axis of the tube of a batch-type horizontal low-pressure CVD apparatus is horizontal, it is desirable for the substrate planar surfaces to be arranged vertically. Conversely, since the axis of the tube of a batch-type vertical low-pressure CVD apparatus is vertical, it is desirable for the substrate planar surfaces to be arranged horizontally.

On the other hand, the chamber of a single low-pressure CVD apparatus may be tubular, as with a batch-type, but there are no particular limitations on its shape. There is a processing room for executing processing on a substrate inside the chamber, but substrates are conveyed into that processing room one at a time. It is desirable for a heater for adjusting the temperature of a substrate to be provided where a substrate is placed in the processing room.

As with a batch-type low-pressure CVD apparatus, a single low-pressure CVD apparatus has a gas introduction section for introducing gas into the processing room, and an exhaust section for discharging gas that is inside the processing room.

A single low-pressure CVD apparatus has a jig charged with a plurality of substrates. The plurality of substrates on the jig is conveyed into the processing room inside the chamber one at a time. An auxiliary room may also be provided between the jig and the chamber. The auxiliary room and the processing room are adjacent to each other and separated by a partition that can be opened and closed. When an auxiliary room is provided, substrates are first conveyed into the auxiliary room one at a time, and then further conveyed into the processing room. When a substrate is conveyed into the auxiliary room, the atmospheric pressure inside the auxiliary room is made lower than the outside air pressure, and then the substrate in the auxiliary room is conveyed into the processing room in which pressure has been reduced.

CNT manufacturing methods of the present invention will now be described with reference to the accompanying drawings.

Figure 16:
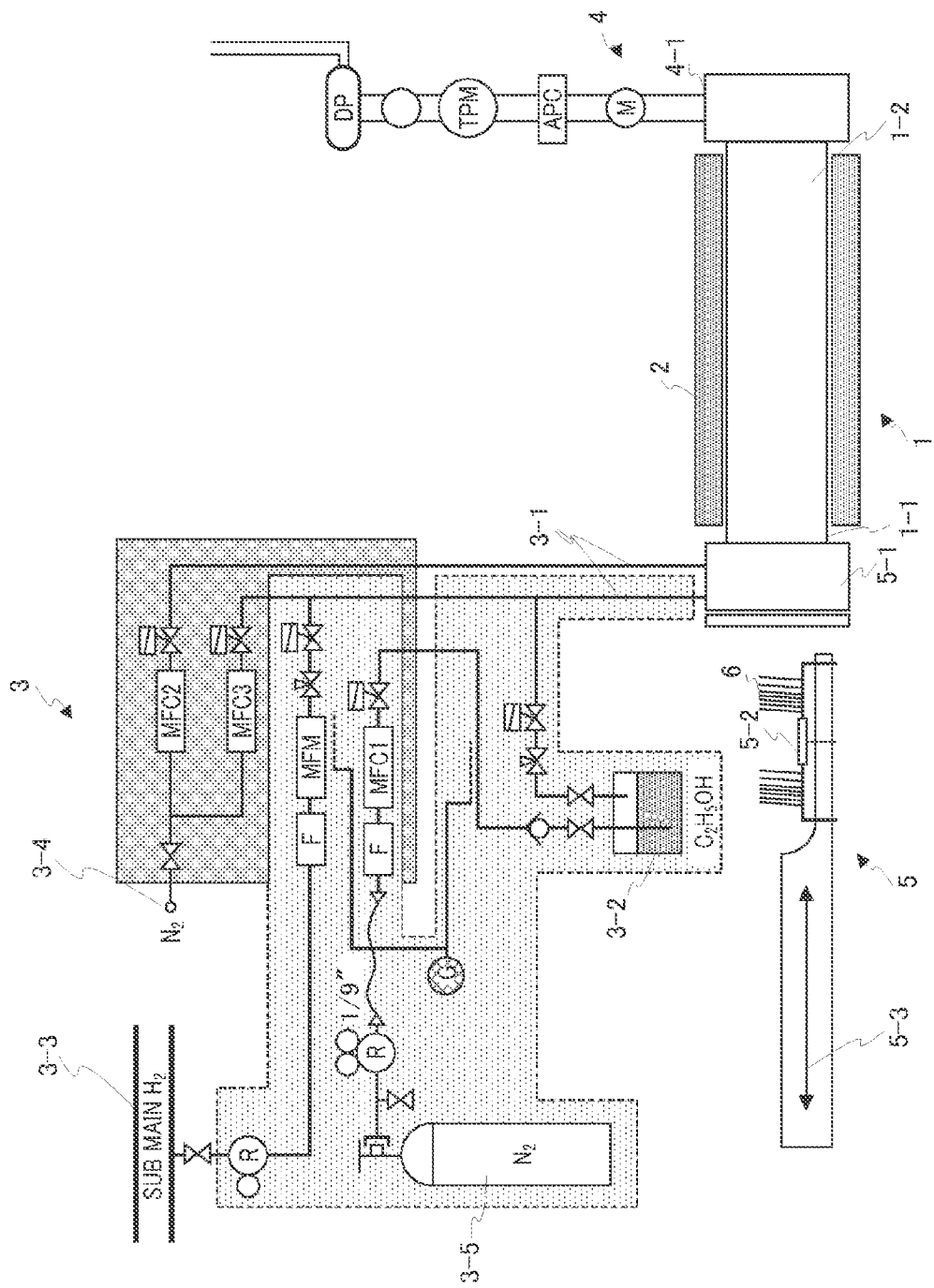
FIG. 16 is a schematic diagram of a batch-type horizontal low-pressure CVD apparatus that implements a CNT manufacturing method of the present invention.

1. CNT Manufacture by CVD using a Batch-Type Horizontal Low-Pressure CVD Apparatus FIG. 16 shows a batch-type low pressure CVD apparatus in which quartz tube 1-1 composing chamber 1 is installed horizontally (the axis of quartz tube 1-1 of the chamber being horizontal). A plurality of substrates 6 is placed in processing room 1-2 inside quartz tube 1-1. Heater 2 is arranged around chamber 1.

Gas introduction section 3 that introduces gas into processing room 1-2 is connected to chamber 1. Gas introduction section 3 has gas introduction inlets 3-1 that are apertures connecting to chamber 1, together with (1) source gas (in the drawing, ethanol) supply source 3-2, (2) reduction gas (in the drawing, nitrogen gas) supply source 3-3, (3) inert gas (in the drawing, hydrogen gas) supply source 3-4, and (4) carrier gas supply source 3-5, communicating with gas introduction inlets 3-1. A carrier gas is a gas that is introduced into processing room 1-2 together with the source gas. The gas introduction section 3 gas paths are provided with mass flow controllers MFC 1 through 3, filters F, gas flow meter MFM, pressure reducing valves R, gas sensor G, and so forth, as appropriate.

Exhaust section 4 that discharges processing room 1-2 gas is connected to chamber 1. Exhaust section 4 has exhaust outlet 4-1 that is an aperture connecting to chamber 1, main valve M, auto pressure controller APC, turbo molecule pump TMP, and diffusion pump DP.

In chamber 1, substrate conveyance-in/out section 5 is provided that conveys substrates 6 into processing room 1-2 and conveys substrates 6 out of processing room 1-2. Substrate conveyance-in/out section 5 has substrate conveyance entrance 5-1 that is an entrance to chamber 1, board (jig) 5-2 that is charged with a plurality of substrates 6, and fork 5-3 that conveys board 5-2 into processing room 1-2 and conveys board 5-2 out of processing room 1-2. Only board 5-2 charged with substrates 6 is arranged in processing room 1-2, where substrate 6 processing (CNT formation and so forth) is performed.

FIG. 19 is a graph showing the relationship between CNT manufacturing processes using the low-pressure CVD apparatus shown in FIG. 16 and substrate temperature. First, board 5-2 charged with substrates 6 is conveyed into processing room 1-2, and the atmospheric pressure inside processing room 1-2 into which substrates 6 have been conveyed is lowered (process 1). In process 1, the substrate temperature can be made a temperature at which a catalyst is not prone to oxidation or below (approximately 500° C. or below), and need not necessarily be room temperature. It is desirable for the atmospheric pressure inside the processing room after pressure reduction to be in the range of 0.1 Torr to 0.6 Torr.

When the atmospheric pressure inside processing room 1-2 has been lowered to a predetermined value, heater 2 arranged around chamber 1 emits heat, and raises the temperature of substrates 6 to a CNT generation temperature (process 2). The CNT generation temperature is between 700° C. and 900° C., for example. In process 2, a reduction gas (hydrogen gas or the like) and an inert gas (nitrogen gas or the like) are introduced into processing room 1-2 while substrates 6 are being heated.

When the temperature of substrates 6 inside processing room 1-2 has risen to the CNT generation temperature, a source gas (ethanol or the like) is introduced into processing room 1-2 (process 3). It is desirable for the temperature of substrates 6 to be maintained at 700° C. to 900° C., and it is desirable for the atmospheric pressure inside processing room 1-2 to be maintained at 0.1 Torr to 0.6 Torr. The duration of process 3 needs only be sufficiently long for CNTs to grow on the substrates, and is normally approximately one hour or less.

When CNTs have grown on substrates 6, the temperature of substrates 6 is lowered (process 4). The temperature of substrates 6 after being lowered should be no higher than a temperature at which the formed CNTs are not oxidized by oxygen in the air. The temperature after being lowered should be approximately 600° C. or below, and need not necessarily be lowered to room temperature. When CNTs are to be manufactured repeatedly by conveying other substrates in after the substrates on which CNTs have been formed have been conveyed out, if the substrate temperature is lowered to room temperature, raising the temperature of the other substrates to the CNT generation temperature requires a large amount of heat, and takes time. It is therefore desirable for the relevant lowered substrate temperature to be approximately 600° C. or below, and to be above room temperature.

After the substrate temperature has been lowered, an inert gas is introduced into processing room 1-2, and the atmospheric pressure is made the same as the outside air pressure. Following this, board 5-2 charged with substrates 6 on which CNTs have been formed is conveyed out of processing room 1-2 (process 5).

Figure 17:
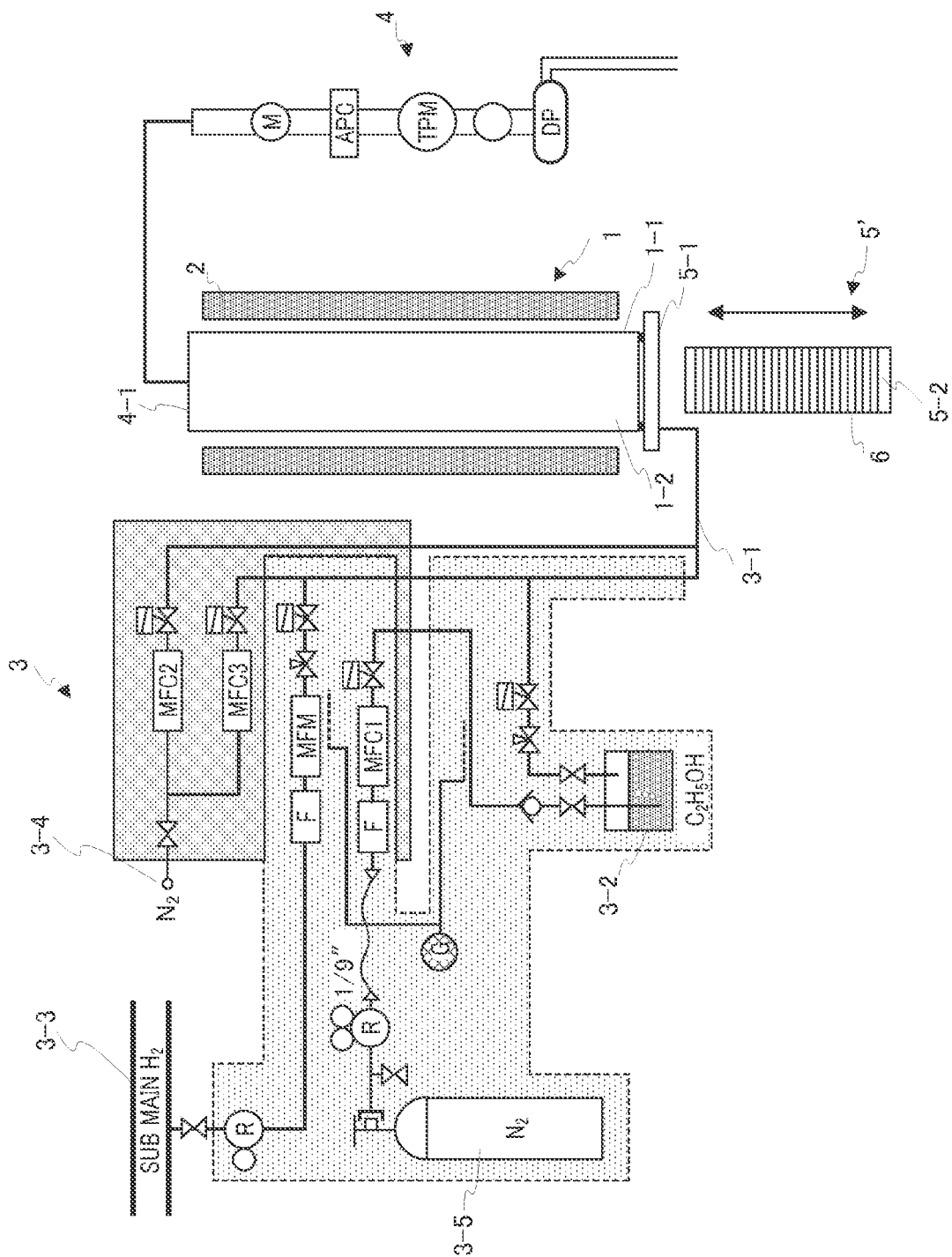
FIG. 17 is a schematic diagram of a batch-type vertical low-pressure CVD apparatus that implements a CNT manufacturing method of the present invention.

2. CNT Manufacture by Vapor Deposition using a Batch-Type Vertical Low-Pressure CVD Apparatus FIG. 17 shows a batch-type low pressure CVD apparatus in which quartz tube 1-1 composing chamber 1 is installed vertically (the axis of quartz tube 1-1 of the chamber being vertical). This batch-type low-pressure CVD apparatus has heater 2, gas introduction section 3, exhaust section 4, and substrate conveyance-in/out section 5' similar to those of the batch-type low-pressure CVD apparatus shown in FIG. 16.

As shown in FIG. 17, substrates 6 are conveyed into processing room 1-2 with their planar surfaces vertical, but apart from this, CNTs are manufactured in the same way as in the method using the apparatus shown in FIG. 16.

Figure 18:
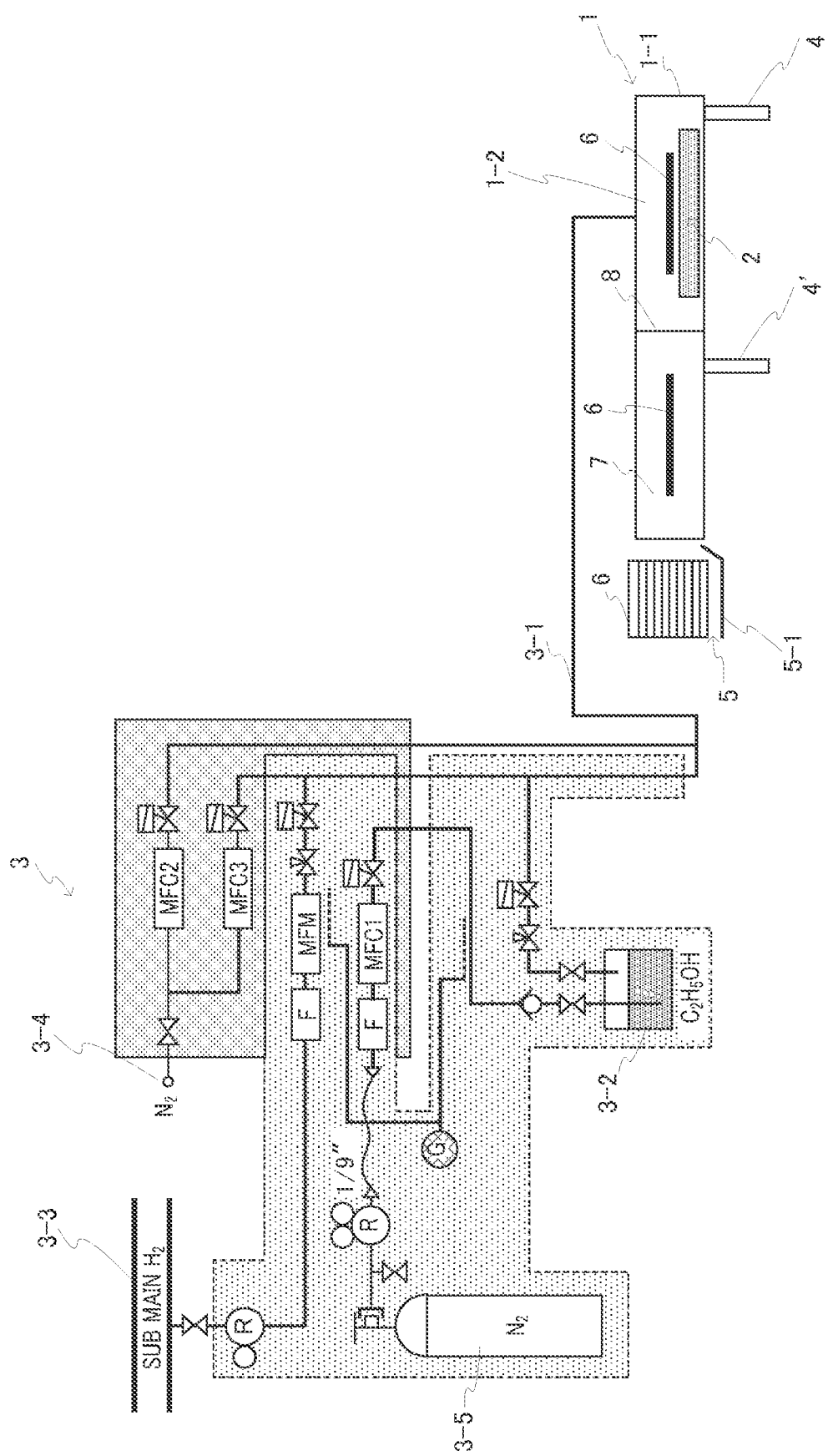
FIG. 18 is a schematic diagram of a single low-pressure CVD apparatus that implements a CNT manufacturing method of the present invention.

3. CNT Manufacture by Vapor Deposition using a Single Low-Pressure CVD Apparatus FIG. 18 shows a single low-pressure CVD apparatus. This single low-pressure CVD apparatus has chamber 1 having processing room 1-2 for treating substrate 6 in the same way as a batch-type low-pressure CVD apparatus (FIG. 16 or FIG. 17), but also has auxiliary room 7 adjacent to chamber 1. This apparatus also has exhaust section 4 that discharges gas that is inside processing room 1-2, and exhaust section 4' that discharges gas that is inside auxiliary room 7. The interior of processing room 1-2 and the interior of auxiliary room 7 are separated by partition 8 that can be opened and closed, and the atmospheric pressure in each can be controlled independently. Also, heater 2 for heating substrates 6 is arranged inside processing room 1-2.

Gas introduction section 3 for supplying gas to processing room 1-2 is connected to chamber 1 of the single low-pressure CVD apparatus. The configuration of gas introduction section 3 can be the same as that of batch-type low-pressure CVD gas introduction section 3 described above.

This single low-pressure CVD apparatus has substrate conveyance-in/out section 5, which has jig 5-2 that is charged with a plurality of substrates 6, a section that conveys substrates 6 into the auxiliary room one at a time, a section that moves a substrate conveyed into the auxiliary room to the processing room, and a section that conveys a substrate conveyed into the processing room out of the processing room (these sections are not shown in the drawing).

First, one of substrates 6 immobilized on jig 5-1 is conveyed into auxiliary room 7, and the atmospheric pressure inside auxiliary room 7 is lowered by means of exhaust section (pump) 4'. Meanwhile, the atmospheric pressure inside processing room 1-2 of chamber 1 is lowered by means of exhaust section (pump) 4.

Partition 8 between the interior of processing room 1-2 and the interior of auxiliary room 7 is opened, and substrate 6 is moved into processing room 1-2. The temperature of substrate 6 that has been moved into processing room 1-2 is raised to a carbon nanotube generation temperature (approximately 700° C. to 900° C.) by heater 2. At this time, a reduction gas and inert gas are introduced into processing room 1-2 by gas introduction section 3. After the temperature of substrate 6 inside processing room 1-2 has been raised, a carbon nanotube source gas is introduced into processing room 1-2 by gas introduction section 3, and carbon nanotubes are grown on substrate 6. After carbon nanotube growth, the temperature of substrate 6 is lowered to a temperature at which carbon nanotubes are not oxidized by oxygen in the air. After its temperature has been lowered, substrate 6 is conveyed out of processing room 1-2.

Meanwhile, while one substrate is being processed in processing room 1-2, another substrate 6 is conveyed into auxiliary room 7, and the atmospheric pressure inside auxiliary room 7 is lowered. When substrate 6 in processing room 1-2 is conveyed out of processing room 1-2, substrate 6 that has been conveyed into auxiliary room 7 is then moved into processing room 1-2, and the same kind of processing is repeated.

The disclosure of Japanese Patent Application No.2008-141161, filed on May 29, 2008, including the specification, drawings and abstract, is incorporated herein by reference in its entirety.

Industrial Applicability

The present invention enables CNT-FETs stably exhibiting an excellent electrical conduction property to be manufactured with good reproducibility, and is suitable for use in the manufacture of integrated devices, sensors, and the like, that include a CNT-FET.

The invention claimed is:

1. A field-effect transistor comprising:
    a gate insulating film;
    a channel including a carbon nanotube arranged on the gate insulating film;
    an insulating protective film covering the carbon nanotube;
    a source electrode and a drain electrode that are arranged on the insulating protective film and are electrically connected to the carbon nanotube via contact holes formed in the insulating protective film;
    a gate electrode formed on the gate insulating film;
    a plasma chemical vapor deposition film covering the insulating protective film; and
    a conductive film formed between the insulating protective film and the plasma chemical vapor deposition film.

2. The field-effect transistor according to claim 1, further comprising a wiring protective film protecting the source electrode and the drain electrode between the insulating protective film and the conductive film.

3. The field-effect transistor according to claim 1, wherein:
    the gate insulating film is formed on a first surface and a second surface of a semiconductor substrate, the first surface and the second surface constituting both sides of the semiconductor substrate;
    the source electrode and the drain electrode are formed on the first surface of the semiconductor substrate on which the gate insulating film is formed; and
    the gate electrode is formed on the gate insulating film formed on the second surface of the semiconductor substrate.

4. The field-effect transistor according to claim 1, wherein:
    the gate insulating film is formed on at least one of surfaces of a semiconductor substrate; and
    the gate electrode, the source electrode and the drain electrode are formed on the gate insulating film formed on the one of the surfaces of the semiconductor substrate.

5. The field-effect transistor according to claim 1, wherein the conductive film is formed in an area covering the carbon nanotube.

6. The field-effect transistor according to claim 1, wherein the conductive film has an edge covered by the plasma chemical vapor deposition film.

7. The field-effect transistor according to claim 1, wherein the conductive film has a thickness between 10 nm and 1,000 nm.

8. The field-effect transistor according to claim 1, wherein the gate insulating film has a thickness between 50 nm and 1,000 nm.

9. A method of manufacturing a field-effect transistor comprising the steps of:
    forming a gate insulating film;
    arranging a carbon nanotube on the gate insulating film;
    forming an insulating protective film covering the carbon nanotube;
    forming on the insulating protective film a source electrode and a drain electrode that are electrically connected to the carbon nanotube via contact holes formed in the insulating protective film;
    forming a wiring protective film that protects the source electrode and the drain electrode;
    forming a conductive film on the wiring protective film; and
    forming a plasma chemical vapor deposition film on the conductive film.

* * * * *